United States Patent
Zhao et al.

(10) Patent No.: US 9,887,679 B2
(45) Date of Patent: Feb. 6, 2018

(54) POWER AMPLIFIER AND GAIN SWITCHING CIRCUIT THEREOF

(71) Applicant: LANSUS TECHNOLOGIES INC., Shenzhen (CN)

(72) Inventors: Qian Zhao, Shenzhen (CN); Liyang Zhang, Shenzhen (CN); Hua Long, Shenzhen (CN); Zhenjuan Cheng, Shenzhen (CN); Dongjie Tang, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 15/418,748

(22) Filed: Jan. 29, 2017

(65) Prior Publication Data

US 2017/0141749 A1    May 18, 2017

Related U.S. Application Data

(63) Continuation of application No. 15/139,087, filed on Apr. 26, 2016, now Pat. No. 9,595,933, which is a
(Continued)

(30) Foreign Application Priority Data

Dec. 30, 2013   (CN) .......................... 2013 1 0746618
Dec. 30, 2013   (CN) .......................... 2013 1 0746807
(Continued)

(51) Int. Cl.
*H03G 3/30*    (2006.01)
*H03F 1/02*    (2006.01)
(Continued)

(52) U.S. Cl.
CPC ......... *H03G 3/3042* (2013.01); *H03F 1/0211* (2013.01); *H03F 1/565* (2013.01);
(Continued)

(58) Field of Classification Search
CPC .................................... H03G 3/30; H03F 1/02
(Continued)

(56) References Cited

U.S. PATENT DOCUMENTS 6,265,935 B1 *  7/2001  Kaneda ................. H03F 1/0277
                                                      330/133
9,602,060 B2 *  3/2017  Gorbachov .......... H03G 3/3042
(Continued)

FOREIGN PATENT DOCUMENTS

CN           1641998 A        7/2005

OTHER PUBLICATIONS

Written Opinion of the International Searching Authority in PCT/CN2014/093421, dated Mar. 2, 2015.

*Primary Examiner* — Patricia T Nguyen
(74) *Attorney, Agent, or Firm* — Syncoda LLC; Feng Ma; Junjie Feng

(57) ABSTRACT

A power amplifier gain switching circuit includes: a gain controller configured to receive an external input signal, output a first input signal, receive an external drive signal, and output a control signal based on the drive signal; an amplifier including: a bias input terminal configured to receive an external bias voltage; a signal input terminal configured to receive the first input signal; a control terminal configured to receive the control signal; and an output terminal configured to output an output signal with a gain; wherein the amplifier is configured to switch a gain factor of the output signal based on the control signal.

18 Claims, 14 Drawing Sheets

Related U.S. Application Data continuation of application No. PCT/CN2014/093421, filed on Dec. 10, 2014, and a continuation of application No. PCT/CN2014/093423, filed on Dec. 10, 2014, and a continuation of application No. PCT/CN2014/093425, filed on Dec. 10, 2014, and a continuation of application No. PCT/CN2014/093426, filed on Dec. 10, 2014.

(30) Foreign Application Priority Data

| Dec. 30, 2013 | (CN) | 2013 1 0746817 |
|---|---|---|
| Dec. 30, 2013 | (CN) | 2013 1 0746831 |

(51) Int. Cl.

| H03F 1/56 | (2006.01) |
|---|---|
| H03F 3/21 | (2006.01) |
| H03F 3/19 | (2006.01) |
| H03G 1/00 | (2006.01) |
| H03F 3/45 | (2006.01) |

(52) U.S. Cl.
CPC ............... *H03F 3/19* (2013.01); *H03F 3/21* (2013.01); *H03F 3/45* (2013.01); *H03G 1/0088* (2013.01); *H03F 2200/111* (2013.01); *H03F 2200/387* (2013.01); *H03F 2200/451* (2013.01)

(58) Field of Classification Search
USPC .......................................................... 330/285
See application file for complete search history.

(56) References Cited

U.S. PATENT DOCUMENTS

| 2003/0151461 | A1* | 8/2003 | Arayashiki | H03G 3/3052 330/278 |
|---|---|---|---|---|
| 2005/0195053 | A1 | 9/2005 | Uemura | |
| 2005/0242883 | A1* | 11/2005 | Anand | H03G 3/3042 330/285 |
| 2007/0298736 | A1* | 12/2007 | Fujioka | H03F 1/0266 455/127.3 |
| 2008/0079499 | A1* | 4/2008 | Tsai | H03F 1/223 330/311 |
| 2012/0099675 | A1* | 4/2012 | Kitamura | H03F 1/0261 375/300 |
| 2017/0133989 | A1* | 5/2017 | Dykstra | H03F 1/3205 |

* cited by examiner

POWER AMPLIFIER AND GAIN SWITCHING CIRCUIT THEREOF

CROSS-REFERENCE TO RELATED APPLICATIONS

The present application is a continuation of, and claims priority to, U.S. patent application Ser. No. 15/139,087 filed on Apr. 26, 2016, which is a continuation of, and claims priority to, PCT Application Nos. PCT/CN2014/093421, PCT/CN2014/093423, PCT/CN2014/093425, and PCT/CN2014/093426, all filed on Dec. 10, 2014, which in turn claim priorities respectively to Chinese Patent Application Nos. CN201310746831.9, CN201310746807.5, CN201310746817.9, and CN201310746618.8, all filed on Dec. 30, 2013. The disclosures of these applications are hereby incorporated by reference in their entirety.

BACKGROUND

The present disclosure relates generally to the field of communication technologies, and more specifically to power amplifiers, such as a multi-mode multi-band (MMMB) power amplifier (PA) and its circuits.

After stepping into 3G/4G age, intelligent, MMMB, dual SIM dual standby, and dual SIM dual active mobile terminal devices become the trend of products due to the facts that mobile communication systems are continuously being improved. Users have higher requirements for roaming, data and other functions of terminal devices, and the market has the requirement for backward compatibility of terminal devices, wherein the MMMB function of the terminal devices is important.

SUMMARY

Most mobile terminal devices are powered by batteries, and RF terminal occupies the most part of terminal power consumption, so the efficiency, namely power amplification efficiency, of all RF front-end products, especially power amplifiers, in the mobile terminal devices is enhanced as much as possible within the permission scope of linearity required by systems. To enhance the efficiency of power amplifiers, on one hand, efficient active devices, including compound semiconductor technologies and devices such as GaAs HBT (GaAs Heterojunction Bipolar Transistor) and SiGe HBT (SiGe Heterojunction Bipolar Transistor), need to be used to the greatest extent; on the other hand, correct structures of fundamental impedance transformers need to be used so that 50Ω standard fundamental impedance can be transformed into the optimal output fundamental impedance high in both linearity and power amplification efficiency, and in other words, fundamental impedance of output loads of active devices is optimized. For mobile communication terminal devices with power supply voltage generally being 3.7 V or so, the optimal output fundamental impedance in a maximum output power mode is generally around 2.5Ω-5Ω. However, generally speaking, the structures of traditional fundamental impedance transformers which are suitable for RF front-end products and capable of achieving fundamental impedance transformation ranging from 2.5Ω-5Ω to 50Ω have a narrowband characteristic. Therefore, all bands or similar bands of practical products need to be optimized; in other words, all bands need to have specific fundamental impedance transformers of output loads respectively.

In practice, before the requirement for MMMB comes up, mostly, a power amplifier for mobile communication terminal devices is an assembly of an amplifier channel for single or similar bands and an output fundamental impedance transformer for single or similar bands. For example, two adjacent bands are covered with a single assembly of a single-channel single-band or dual-band UMTS (Universal Mobile Telecommunications System) power amplifier while two pairs of adjacent bands are covered with two assemblies of dual-channel quad-band GSM/GPRS/EDGE FEMs (Front End Modules). The method is still used in implementation of a traditional MMMB PA (multi-mode multi-band power amplifier); in other words, the interesting bands are covered by segments according to the instantaneous bandwidth capacity of output fundamental impedance transformers, so that one amplifier channel is configured to each output fundamental impedance transformer. For the time being, competition in the industry of RF front-ends for mobile communication terminal devices is intense, so achieving low cost and even ultra-low cost of products becomes a long-term goal on the premise of keeping all properties of RF front-end products while configuring one amplifier channel to each output fundamental impedance transformer is high in cost and large in module area.

In designing of a power amplifier, especially a saturated power amplifier, the output power of the power amplifier needs to be controlled, and the power amplifier is required to output different output powers in application environments of different communication intensities.

For the time being, three conventional power control methods are provided as follows: The first method is limiting power voltage across the amplifier, wherein an output of a power controller is used as power voltage across the amplifier and is controlled via a Ramp signal. In this way, the power voltage across the amplifier changes along with the Ramp signal, and therefore output power can be controlled. The second method is performing power control through current detection feedback, wherein working current across the amplifier is detected and fed back to a base band for processing, the base band changes the working current across the amplifier via the power controller, and power control is completed through the feedback. The third method is performing power control via power couplers, wherein the output power is detected via directional couplers on the periphery of a chip, a power value is returned to the base band which correspondingly changes the output power via the power controller (or by adjusting input power), and then power control is achieved through the feedback.

Among the three methods, the third method requires design for extra power couplers, so the design cost is high; the first method and the second method have common defects that load mismatching of the power amplifier causes a power change which is not affected by a power control feedback loop, and as a result, power control is not accurate enough.

There are multiple gain modes available for a power amplifier, such as high gain/low gain modes or high gain/medium gain/low gain modes. The traditional methods of gain implementation include:

(1) Switch the gain by adjusting the voltage/current value of bias circuit under the circumstance that the circuit is under different biases. The disadvantage of the method is that the difference between high gain and low gain is not great.

(2) Switch the high and low gain mode by switching between different signal channels. The disadvantage of the method is that the chip area is quite large, so switching gain may lead to discontinuous phases.

In an aspect, a multi-mode multi-band power amplifier is provided to reduce the RF front-end cost and module area through multiplexing of an amplifier channel.

A multi-mode multi-band power amplifier comprises a controller, a wide-band amplifier channel and a fundamental impedance transformer. The controller receives an external signal and outputs a control signal according to the external signal.

The wide-band amplifier channel is controlled by the controller, receives a single-band or a multi-band RF signals through the input terminal, performs power amplification on the RF signals and outputs the RF signals through the output terminal.

The fundamental impedance transformer comprises a first segment shared by the RF signals in all bands, second segments respectively special for the RF signals in all bands, and a switching circuit which is coupled between the first segment and the second segments. The first segment is connected with the output terminal of the wide-band amplifier channel. The optimal output fundamental impedance of corresponding bands is formed at the output terminals of the second segments. The switching circuit is controlled by the controller to separate the RF signals subject to power amplification to the second segments in a switchable mode for multiplexed outputs, wherein each output corresponds to one band.

In some embodiments, the first segment is a shared matching circuit. The input terminal of the shared matching circuit is connected with the output terminal of the wide-band amplifier channel so that the RF signals subject to power amplification can be output after being subject to primary output fundamental impedance matching.

The second segments are a plurality of special matching circuits, wherein the special matching circuits match the RF signals, subject to primary output fundamental impedance matching, of the corresponding bands to the optimal output fundamental impedance and then output the RF signals.

The switching circuit is a first switching array comprising a plurality of first switching devices. The first switching devices are controlled by the controller to couple the RF signals, subject to primary output fundamental impedance matching, of the corresponding bands to the corresponding special matching circuits.

In some embodiments, the shared matching circuit is a low fundamental impedance circuit, and the special matching circuits are high fundamental impedance circuits.

In some embodiments, the shared matching circuit comprises a first inductor and a first capacitor. One terminal of the first inductor receives the RF signals subject to power amplification, and the other terminal is connected with the input terminals of the first switching devices and grounded through the first capacitor.

In some embodiments, the fundamental impedance transformer further comprises a harmonic impedance tuner controlled by the controller so that the optimal output harmonic impedance of the corresponding bands can be formed at the output terminal of the wide-band amplifier channel.

In some embodiments, the fundamental impedance transformer further comprises a plurality of cascadable directional couplers which are coupled to the output terminals of the special matching circuits respectively.

In some embodiments, each special matching circuit comprises a second inductor and a second capacitor, and one terminal of the second inductor is connected with the corresponding first switching device and receives the RF signals subject to primary output fundamental impedance matching, and the other terminal is grounded through the corresponding second capacitor and outputs the RF signals matched to the optimal output fundamental impedance.

In some embodiments, each harmonic impedance tuner comprises a second switching array and one or more LC resonators, and the second switching array comprises one or more second switching devices controlled by the controller.

One terminal of the LC resonator is coupled with the output terminal of the wide-band amplifier channel, and the other terminal is grounded through the second switching devices.

In some embodiments, the multi-mode multi-band power amplifier is characterized by further comprising a third switching array. The third switching array comprises a plurality of third switching devices controlled by the controller, and one terminal of the third switching device is coupled with the input terminal of the wide-band amplifier channel, and the other terminal receives the single-band or multi-band RF signals from different external ports.

In some embodiments, the controller comprises a voltage regulator and a decoder. The controller uses output voltage of the voltage regulator as reference to output a control signal including an analog domain and/or a digital domain. The decoder is used for decoding an external command.

In some embodiments, the controller further comprises a register which is used for storing the external command.

According to the multi-mode multi-band power amplifier, the first segment with low fundamental impedance of the fundamental impedance transformer and the high-cost wide-band amplifier channel are shared to the greatest extent, and the low-cost switching circuit is designed at the junction of the first segment and the second segments of a multi-segment fundamental impedance transformation circuit. In this way, selection, regulation, assembling and combination can be conveniently performed, so that a complete output load fundamental impedance transformation circuit for all bands is formed. On one hand, the power amplification efficiency of an original single channel covering a single band is kept while multiple bands are covered through a wide-band amplifier channel; on the other hand, the wide-band amplifier channel and the first segment of the fundamental impedance transformer are fully shared, so miniaturization and cost reduction of the MMMB PA are extremely facilitated. Under the control of the controller, according to the external signal from a platform, the wide-band amplifier channel and corresponding channels of the fundamental impedance transformer are selected, regulated, assembled and combined, and then an amplified link is formed for the specific mode of each specific band, so the optimal output load fundamental impedance required by the preferred linear output power and power amplification efficiency of all the bands is achieved. Accordingly, the cost of RF front-end products, especially MMMB PA products, for mobile communication terminal devices is reduced while all the MMMB PA property indices including gain, efficiency, linearity, scattering, stability margin, tolerance and the like are kept.

In another aspect, a power amplifier gain switching circuit is provided, comprising a gain control unit which receives an external input signal, and outputs a first input signal, and receives an external drive signal and then outputs a control signal depending on the said drive signal; an amplifier unit, includes: a bias input terminal for receiving an external bias voltage, a signal input terminal for receiving the said first input signal, a control terminal for receiving the said control signal, and an output terminal for outputting an output signal gained.

In some embodiments, the amplifier unit switches a gain factor of the output signal gained depending on the said control signal.

In some embodiments, the power amplifier gain switching circuit is characterized in that the gain control unit comprises a first DC-blocking capacitor, a first resistor, a first power transistor, a second power transistor, a second resistor and a third resistor, wherein one terminal of the first DC-blocking capacitor receives the input signal, while the other terminal outputs the first input signal through the first resistor.

In some embodiments, the base of the first power transistor and of the second power transistor receives the drive signal and their emitters are grounded. The collector of the first power transistor is connected in series with the first resistor through the second resistor, and the collector of the second power transistor is connected with the control terminal through the third resistor.

In some embodiments, the power amplifier gain switching circuit is characterized in that there are either one gain control unit or multiple gain control unit connected in parallel.

In some embodiments, the power amplifier gain switching circuit is characterized in that, when there are multiple gain control units connected in parallel, the first DC-blocking capacitors in the gain control units are combined into one DC-blocking capacitor, and the first resistors in the gain reduction units are combined into one resistor.

In some embodiments, the power amplifier gain switching circuit is characterized in that the drive signal comprises a high level and a low level. When the gain control unit is connected to the low level, the gain control unit will stop and not output the control signal; and when the gain control unit is connected to the high level, the gain control unit will turn on and output the control signal, thus reducing the gain factor of the output signal.

In some embodiments, the power amplifier gain switching circuit is characterized in that the gain control unit is used for blocking the input signal and lowering the level to generate the first input signal.

In some embodiments, the power amplifier gain switching circuit is characterized in that the amplifier unit comprises a first amplifier and a second amplifier.

In some embodiments, the first amplifier includes: a first bias input terminal for receiving the said bias voltage, a first signal input terminal for receiving the said first input signal, a first output terminal for outputting a primary output signal gained for the first time, and a control terminal for receiving the said control signal.

In some embodiments, the second amplifier includes: a second bias input terminal for receiving the said bias voltage, a second signal input terminal for receiving the said primary output signal, a second output terminal for outputting the said output signal gained for the second time.

In some embodiments, the power amplifier gain switching circuit is characterized in that the first amplifier comprises a third power transistor, a fourth power transistor, a second DC-blocking capacitor, a fourth resistor and a first inductor.

In some embodiments, the base of the third power transistor is used as the first bias input terminal, and the collector of the third power transistor is connected to the first power supply. The emitter is connected to the base of the fourth power transistor through the fourth resistor. The base of the fourth power transistor is used as the control terminal, and the collector of the fourth power transistor is used as the first output terminal and connected to one terminal of the first inductor. The other terminal of the first inductor is connected to the second power supply, with the emitter of the fourth power transistor grounded. One terminal of the second DC-blocking capacitor is used as the first signal input terminal, and another terminal is connected to the base of the fourth power transistor.

In some embodiments, the power amplifier gain switching circuit is characterized in that the second amplifier comprises a fifth power transistor, a sixth power transistor, a third DC-blocking capacitor, a fifth resistor and a second inductor.

In some embodiments, the base of the fifth power transistor is used as the first bias input terminal, and the collector of the third power transistor is connected to the first power supply. The emitter is connected to the base of the sixth power transistor through the fifth resistor, and the collector of the sixth power transistor is used as the output terminal of the amplifier unit and connected to one terminal of the first inductor. The other terminal of the second inductor is connected to a third power supply, with the emitter of the sixth power transistor grounded. One terminal of the third DC-blocking capacitor is used as the second signal input terminal and connected to the collector of the fourth power transistor, and another terminal connected to the base of the sixth power transistor.

In some embodiments, the power amplifier includes a bias voltage generating circuit, a drive signal generating circuit, and a power amplifier gain switching circuit described above.

In another aspect, a power amplifier gain attenuation circuit is provided, including a gain attenuation unit which receives an input signal, an external drive signal and a bias voltage, and outputs a secondary input signal after attenuating the input signal depending on the said drive signal and bias voltage; an amplifier unit, includes: a bias input terminal for receiving the said bias voltage, a signal input terminal for receiving the said secondary input signal, and an output terminal for outputting a gained output signal.

In some embodiments, the power amplifier gain attenuation circuit is characterized in that the gain attenuation unit comprises a first DC-blocking capacitor, a first resistor, a first power transistor, a second power transistor and a third resistor, wherein one terminal of the first DC-blocking capacitor receives the input signal, while the other terminal outputs the secondary input signal.

In some embodiments, the base of the first power transistor gets access to the drive signal, the emitter of the first power transistor is grounded, and the collector of the first power transistor is connected to the other terminal of the first DC-blocking capacitor.

In some embodiments, the base of the third power transistor gets access to a bias voltage, the collector is connected to the first power source and the emitter is connected to the emitter of the second power transistor via the first resistor. The emitter of the second power transistor is connected to the base of the second power transistor, and the collector of the second power transistor is connected to the other terminal of the first DC-blocking capacitor.

In some embodiments, the power amplifier gain attenuation circuit is characterized in that there is either one gain attenuation unit or multiple parallel gain attenuation units.

In some embodiments, the power amplifier gain attenuation circuit is characterized in that, when there are multiple parallel gain attenuation units, multiple first DC-blocking capacitors in the gain attenuation units are combined into one DC-blocking capacitor.

In some embodiments, the power amplifier gain attenuation circuit is characterized in that the drive signal comprises a high level and a low level.

In some embodiments, when the gain attenuation unit gets access to the low level, the gain attenuation unit will stop without attenuating the input signal; when the gain attenuation unit gets access to the high level, the gain attenuation unit will turn on and attenuate the input signal.

In some embodiments, the power amplifier gain attenuation circuit is characterized in that the gain attenuation unit is used to block the input signal and generate the secondary input signal after lowering the level.

In some embodiments, the power amplifier gain attenuation circuit is characterized in that the amplifier unit comprises a first amplifier and a second amplifier.

In some embodiments, the first amplifier includes: a first bias input terminal for receiving the said bias voltage, a first signal input terminal for receiving the said secondary input signal, and a first output terminal for outputting a primary output signal gained for the first time.

In some embodiments, the second amplifier includes: a second bias input terminal for receiving the said bias voltage, a second signal input terminal for receiving the said primary output signal, a second output terminal for outputting the said output signal gained for the second time.

In some embodiments, the power amplifier gain attenuation circuit is characterized in that the first amplifier comprises a fourth power transistor, a fifth power transistor, a second DC-blocking capacitor, a second resistor and a first inductor.

In some embodiments, the base of the fourth power transistor is used as the first bias input terminal, the collector is connected to the first power source, and the emitter is connected to the base of the fifth power transistor via the second resistor. The collector of the fifth power transistor is used as the first output terminal and connected to one terminal of the first inductor. The other terminal of the first inductor is connected to a second power source, and the emitter of the fifth power transistor is grounded. One terminal of the second DC-blocking capacitor is used as the first signal input terminal, and the other terminal is connected to the base of the fifth power transistor.

In some embodiments, the power amplifier gain attenuation circuit is characterized in that the second amplifier comprises a sixth power transistor, a seventh power transistor, a third DC-blocking capacitor, a third resistor and a second inductor.

In some embodiments, the base of the sixth power transistor is used as the first bias input terminal, the collector is connected to the first power source, and the emitter is connected to the base of the seventh power transistor via the third resistor. The collector of the seventh power transistor is used as the output terminal of the amplifier unit and connected to one terminal of the first inductor. The other terminal of the second inductor is connected to a third power source, and the emitter of the seventh power transistor is grounded. One terminal of the third DC-blocking capacitor is used as the second signal input terminal and connected to the collector of the fifth power transistor, and the other terminal connected to the base of the seventh power transistor.

In some embodiments, the power amplifier comprises a bias voltage generating circuit, a drive signal generating circuit, and a power amplifier gain attenuation circuit as described above.

In another aspect, a power amplifier output power control circuit is provided, which increases the accuracy of power control by weakening the relationship between load mismatching of the power amplifier and output power through negative feedback.

In some embodiments, the power amplifier output power control circuit comprises a voltage dividing network; a first operational amplifier of which the negative input terminal receives a power control signal; a first PMOS transistor of which the gate electrode is connected to the output terminal of the first operational amplifier, the source electrode is connected to an external power source, and the drain electrode is grounded via the voltage dividing network.

In another aspect, a power amplifier is provided, of which the power end is connected to the drain electrode of the first PMOS transistor, the input terminal gets access to a signal to be amplified, and the output terminal amplifies the signal.

In some embodiments, a current sampling module is provided for producing sampling current after sampling current across the first PMOS transistor and providing a negative feedback signal for the positive input terminal of the first operational amplifier according to the sampling current so that the total output power of the power amplifier keep unchanged, wherein the negative feedback signal is input into the positive input terminal of the first operational amplifier via the voltage dividing network.

In some embodiments, the current sampling module comprises one or more PMOS transistors, the one or more PMOS transistors have mirror image relationships with the first PMOS transistor to copy current across the first PMOS transistor and to output the negative feedback signal after adjusting the negative feedback signal based on the current; or the current sampling module samples the current across the first PMOS transistor and outputs the negative feedback signal after current-voltage-current conversion.

In some embodiments, the negative feedback signal is a current signal and is in inverse proportion to a voltage value at the power end of the power amplifier.

In some embodiments, the current sampling module comprises a second PMOS transistor, a second current mirror image and a third current mirror image. The first current mirror image is formed by the second PMOS transistor and the first PMOS transistor. The first current mirror image, the second current mirror image and the third current mirror image are sequentially connected. The third current mirror image outputs the negative feedback signal.

In some embodiments, the second current mirror image comprises a first NMOS transistor and a second NMOS transistor, and the third current mirror image comprises a third PMOS transistor and a fourth PMOS transistor.

The gate electrode of the second PMOS transistor is connected to the output terminal of the first operational amplifier, the source electrode of the second PMOS transistor is connected to the power source, and the drain electrode of the second PMOS transistor is connected to the drain electrode of the first NMOS transistor.

The gate electrode of the first NMOS transistor is connected to the drain electrode of the first NMOS transistor and the gate electrode of the second NMOS transistor, the source electrode of the first NMOS transistor and the source electrode of the second NMOS transistor are grounded, and the drain electrode of the second NMOS transistor is connected to the drain electrode of the third PMOS transistor.

The gate electrode of the third PMOS transistor is connected to the drain electrode of the third PMOS transistor and the gate electrode of the fourth PMOS transistor, the source electrode of the third PMOS transistor and the source electrode of the fourth PMOS transistor are connected to the power source, and the drain electrode of the fourth PMOS transistor outputs the negative feedback signal.

In some embodiments, the current sampling module further comprises a second operational amplifier. The positive input terminal and the negative input terminal of the second operational amplifier are connected to the drain electrode of the first PMOS transistor and the drain electrode of the second PMOS transistor respectively. The output terminal of the second operational amplifier is connected to the gate electrode of the first PMOS transistor and the gate electrode of the second PMOS transistor.

In some embodiments, the current sampling module comprises a second PMOS transistor and a conversion device used for current-voltage-current conversion, and the first current mirror image is formed by the second PMOS transistor and the first PMOS transistor.

The gate electrode of the second PMOS transistor is connected to the output terminal of the first operational amplifier, the source electrode of the second PMOS transistor is connected to the power source, the drain electrode of the second PMOS transistor is connected to the input terminal of the conversion device, and the output terminal of the conversion device outputs the negative feedback signal.

In some embodiments, the current sampling module further comprises a second operational amplifier. The positive input terminal and the negative input terminal of the second operational amplifier are connected to the drain electrode of the first PMOS transistor and the drain electrode of the second PMOS transistor respectively. The output terminal of the second operational amplifier is connected to the gate electrode of the first PMOS transistor and the gate electrode of the second PMOS transistor.

In some embodiments, the voltage dividing network comprises a first resistor and a second resistor. The first end of the first resistor gets access to the negative feedback signal and is connected to the positive input terminal of the first operational amplifier, and the second end of the first resistor is grounded. The first end of the second resistor is connected to the drain electrode of the first PMOS transistor, and the second end of the second resistor is connected to the first end of the first resistor.

In some embodiments, the voltage dividing network comprises the first resistor, a third resistor and a fourth resistor. The first end of the first resistor is connected to the positive input terminal of the first operational amplifier, and the second end of the first resistor is grounded. The first end of the third resistor gets access to the negative feedback signal, and the second end of the third resistor is connected to the first end of the first resistor. The first end of the fourth resistor is connected to the drain electrode of the first PMOS transistor, and the second end of the fourth resistor is connected to the first end of the third resistor.

In the power amplifier output power control circuit, when the load change of the power amplifier causes the change of the current across the first PMOS transistor, the sampled and fed back current will adjust the voltage value at the power end of the power amplifier; when the current across the first PMOS transistor increases, the voltage value decreases; when the current across the first PMOS transistor decreases, the voltage value increases. Accordingly, the total output power of the power amplifier can keep unchanged, so the corresponding relationships between load impedance changes and output powers can be weakened, and power control can be more accurate.

Other embodiments, implementations, and advantages may become apparent in view of the following descriptions and the attached drawings.

BRIEF DESCRIPTION OF THE DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the present disclosure. Based on the described embodiments of the disclosure, those ordinarily skilled in the art can obtain other embodiment(s), which come(s) within the scope sought for protection by the disclosure.

With the maturity of novel semiconductor switching devices like SOIs and technologies, the maturity and progress of cost reduction of SMT (Surface Mounted Technology)-free and flip-chip packaging technologies, the possibility of further reducing the implementation cost of traditional MMMB PAs comes up. The possibility lies in the fact that the bandwidth characteristic of an amplifier channel in a common mobile communication band is substantially superior to that of an output fundamental impedance transformer. Accordingly, the cost of RF front-end products in mobile terminal devices can be reduced through multiplexing of wide-band amplifier channels, and the method is especially suitable for covering MMMB PAs with large band intervals.

The disclosure aims to solve the technical problems about MMMB multiplexing of wide-band amplifier channels and MMMB PA output fundamental impedance transformers in RF front-end products, especially MMMB PA products, for mobile communication terminal devices, so that the production cost of RF front-end products, especially MMMB PA products, for mobile communication terminal devices can be reduced while all property indexes are kept.

Figure 1:
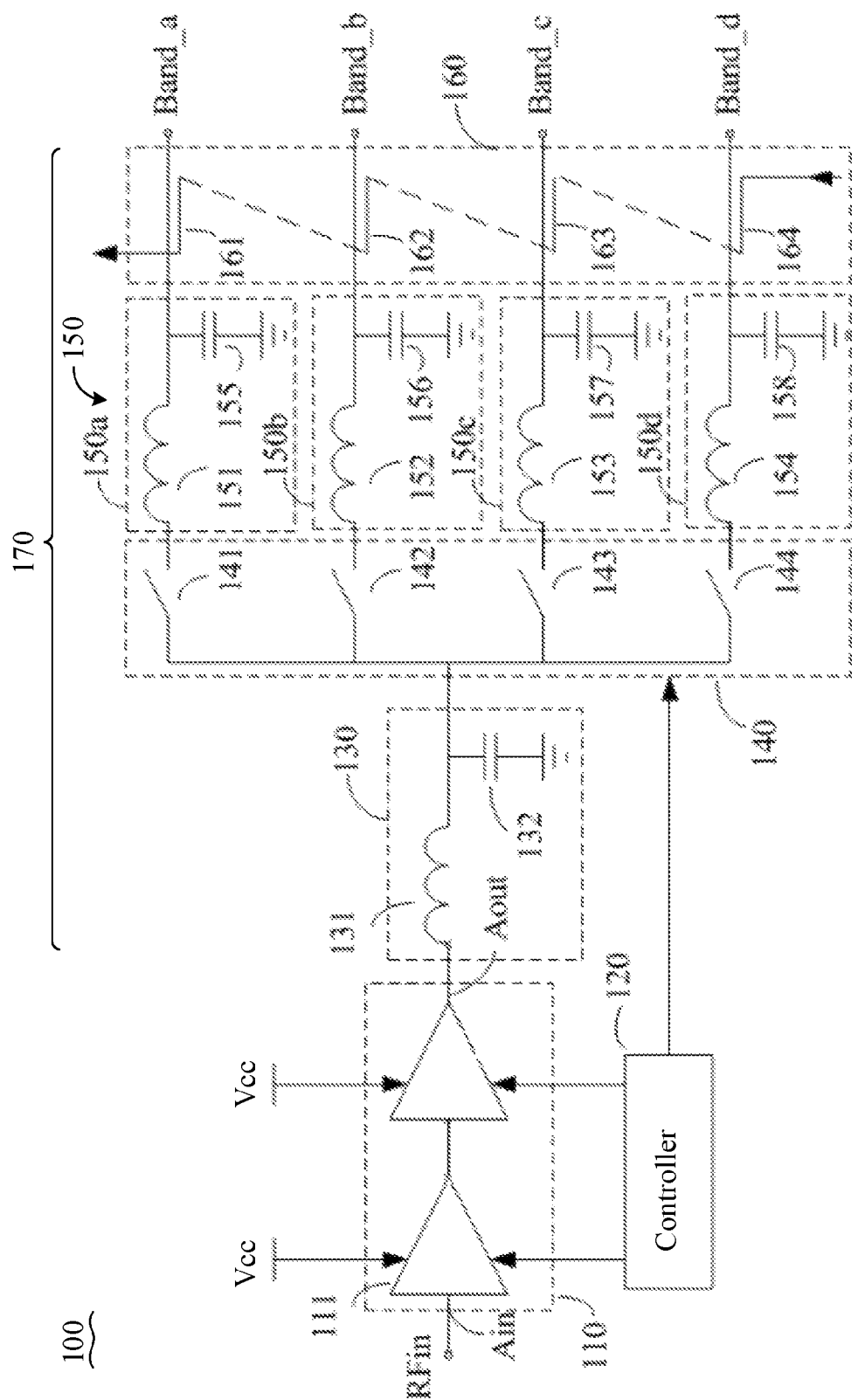
FIG. 1 is a schematic diagram of the multi-mode multi-band power amplifier in the first embodiment.
Figure 2:
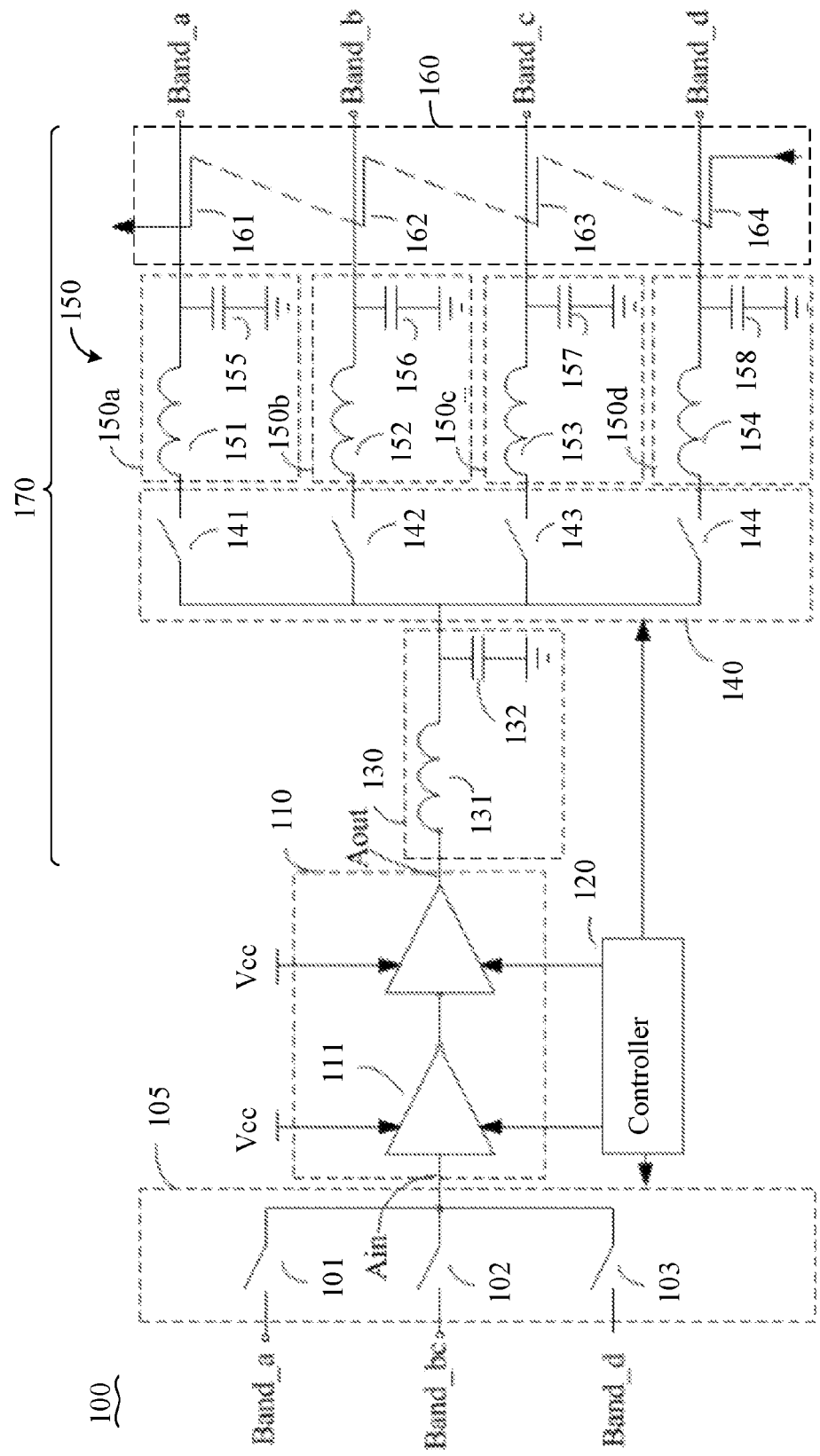
FIG. 2 is a schematic diagram of the multi-mode multi-band power amplifier in the second embodiment.
Figure 3:
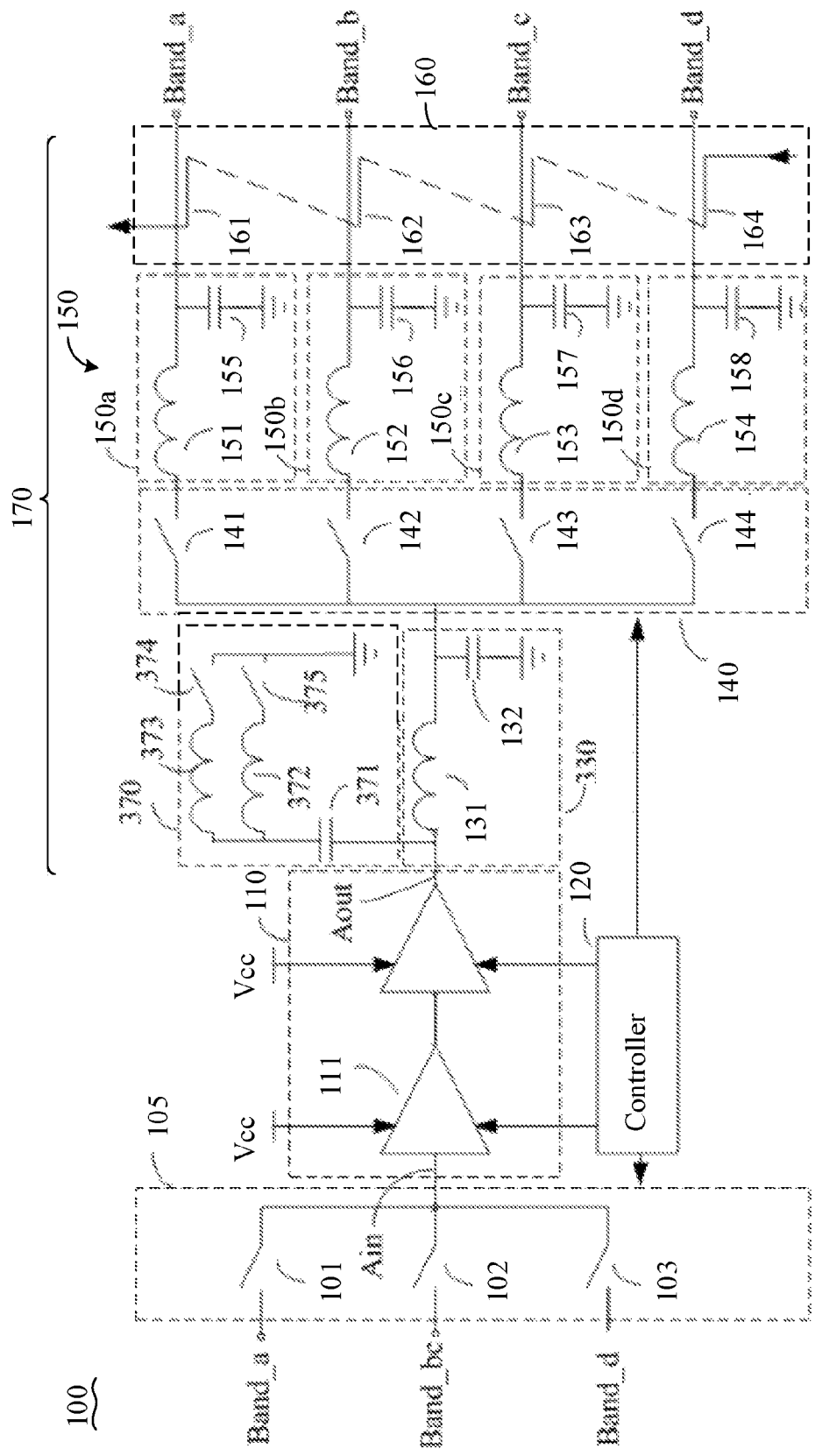
FIG. 3 is a schematic diagram of the multi-mode multi-band power amplifier in the third embodiment.

With reference to FIG. 1, FIG. 2, and FIG. 3, the multi-mode multi-band power amplifier (MMMB PA) 100 comprises a wide-band amplifier channel 110, a controller 120 and a fundamental impedance transformer 170. A power interface Vcc of the wide-band amplifier channel 110 is compatible with APT (Average Powder Tracking), EPT (Envelope Powder Tracking) and ET (Envelope tracking). An interface (not shown in the drawings) for receiving an external signal, of the controller 120 is compatible with control interface standards like GPIO (General Purpose Input Output), SPI (Serial Peripheral Interface), I2C (Inter-Integrated Circuit) and MIPI (MIPI Alliance) RFFE (Radio Frequency Front End).

Referring to FIG. 1, FIG. 2, and FIG. 3, the wide-band amplifier channel 110 is controlled by the controller 120, the wide-band amplifier channel 110 receives single-band or multi-band RF (Radio Frequency, RF) signals Rfin through the input port Ain, performs power amplification on the RF signals Rfin and outputs the RF signals through the output port Aout.

The wide-band amplifier channel 110 is composed of one or more amplification stages and provided with the input port Ain and the output port Aout. All the amplification stages 111 of the wide-band amplifier channel 110, on one hand, accept control from the control signal of the controller 120 through the control interfaces to transform the working modes including gain, linearity, efficiency and other parameters, and are powered by a power source through power interfaces Vcc on the other hand so that the DC power required for amplifying the RF signals can be acquired. The power source can be a battery bank from a mobile communication terminal device system and can also be an output of a power management circuit from a mobile communication terminal device. More typically, the power source can be a DC-DC convertor in APT or EPT or ET standards from 2G/3G/4G wireless communication system.

The wide-band amplifier channel 110 is provided with an input port Ain and an output port Aout, amplifies the RF signals entering input port Ain in all bands, and transmits the RF signals to the fundamental impedance transformer 170 through the output port Aout.

The wide-band amplifier channel 110 in the MMMB PA 100 can be implemented in the form of an MMIC (Monolithic Microwave Integrated Circuit) through GaAs HBT, SiGe HBT, GaAs BiFET (Bipolar & Field Effect transistor), GaAs BiHEMT (Bipolar & High Electron Mobility Transistor), SOI CMOS(Silicon On Insulator Complementary Metal Oxide Semiconductor), LDMOS (Laterally Diffused Metal Oxide Semiconductor) and other devices or technologies. It can form the MMMB PA 100 or a front-end module including the MMMB PA 100 in the form of MCM (Multi Chip Model) together with other semiconductor chips, SMT devices, substrates and/or lead frames in the packaging forms including SiP (System in Package), flip-chip, LGA (Land Grid Array) and QFN (Quad Flat No-lead Package).

The controller 120 receives an external signal from a platform and outputs a control signal according to the external signal. A control interface of the controller 120 and an external platform (like an operating platform of a mobile terminal) is compatible with interface standards like GPIO, SPI, I2C/MIPI RFFE and can be typically implemented in the form of an RFIC (Radio Frequency Integrated Chip)/ Analog IC through SOI CMOS, Bulk Si CMOS and other devices or technologies. It can form the MMMB PA 100 or a front-end module including the MMMB PA 100 in the form of MCM together with other semiconductor chips, SMT devices, substrates and/or lead frames in the packaging forms including SiP, flip-chip, LGA and QFN.

According to FIG. 1, the fundamental impedance transformer 170 comprises a first segment 130 shared by RF signals in all bands, second segments 150 respectively specific for the RF signals in all bands, and a switching circuit 140 which is coupled between the first segment 130 and the second segments 150. The switching circuit 140 is controlled by the controller 120, the first segment 130 is connected with the output port Aout of the wide-band amplifier channel 110, and the optimal output fundamental impedance of the corresponding bands is formed at the output terminals of the second segments 150. The switching circuit 140 is controlled by the controller 120 to separate the RF signals subject to power amplification to the second segments 150 in a switchable manner for multiplexed outputs, wherein each output corresponds to one band.

Furthermore, the first segment 130 is a shared matching circuit 130, the switching circuit 140 is a first switching array 140, and the second segments 150 are a plurality of specific matching circuits comprising the specific matching circuits 150a-d. According to the multi-mode multi-band power amplifier, the wide-band amplifier channel 110 and the first segment 130 with low fundamental impedance of the fundamental impedance transformer 170 are shared to the greatest extent, and the first switching array 140 is designed at the junction of the first segment 130 and the second segments 150 so that selection, regulation, assembling and combination can be performed conveniently to form a complete fundamental impedance transformation circuit for all the bands.

The input terminal of the shared matching circuit 130 is connected with the output port Aout of the wide-band amplifier channel 110, so that the RF signals subject to power amplification can be subject to primary output fundamental impedance matching and then be output. The specific matching circuits 150a-d match the RF signals, subject to primary output fundamental impedance matching, in the corresponding bands to the optimal output fundamental impedance and then output the RF signals. The first switching array 140 comprises a plurality of first switching devices 141-144 which are controlled by the controller 120 to couple the RF signals, subject to primary output fundamental impedance matching, in the corresponding bands to the corresponding specific matching circuits 150a-d.

In some embodiments, the shared matching circuit 130 comprises a first inductor 131 and a first capacitor 132. One terminal of the first inductor 131 receives the RF signals subject to power amplification, and the other terminal is connected with the input terminals of the first switching devices 141-144 and grounded through the first capacitor 132.

In the embodiment, the shared matching circuit 130 is formed by connecting the first inductor 131 in series and connecting an LC assembly of the capacitor 132 in parallel, wherein the LC assembly transforms 2-5Ω low fundamental impedance required by the wide-band amplifier channel 110 into high fundamental impedance relatively close to 50Ω. Due to the facts that the shared matching circuit (first segment) 130 is located at a low impedance segment of the fundamental impedance transformer 170, and the selected circuit topology structure and self loss of matching elements have great influence on the property indexes like power amplification efficiency and linearity of the MMMB PA, a high-Q (quality) value device is selected for the shared first segment 130. The high-Q value device comprises a high-Q value first inductor 131 and a high-Q value first capacitor 132, wherein the possible implementation modes of the high-Q value first inductor 131 comprise one or more assemblies of one piece/set of wire bonds, substrate integrated inductors and off-chip SMT inductors. Possible changes of equivalent topology structures and modes which are not limited in the embodiments at least comprise element positions, connection, quantity and the like in the sense of topology structures. The possible implementation modes of the high-Q value first capacitor 132 comprise one or more assemblies of on-chip capacitors, SMT capacitors and substrate integrated capacitors.

Besides, the shared matching circuit 130 can form the MMMB PA 100 or a front-end module including the MMMB PA 100 in the form of MCM together with other semiconductor chips, SMT devices, substrates and/or lead frames in the packaging forms including SiP, flip-chip, LGA and QFN.

In the embodiment, the fundamental impedance transformer 170 only comprises one shared matching circuit 130 which is suitable for the MMMB PA with smaller band intervals. For example, It may be considered that the MMMB PA 100 with 700 MHz-915 MHz (Bands 5, 8, 12, 17-20 and the like) or 1.7-2.7 GHz (Bands 1-4, 7, 33-41 and the like) needing to cover 700 MHz-2.7 GHz octaves can be expanded through the disclosure. For example, the shared matching circuit 130 is regulated through additional switching devices, and/or two or more shared matching circuits 130 are used in the fundamental impedance transformer 170 while two or more wide-band amplifier channels 110 are adopted.

In some embodiments, taking the specific matching circuit 150a as an example for description, the specific matching circuit 150a comprises a second inductor 151 and a second capacitor 155, with one terminal of the second inductor 151 being connected with the corresponding first switching device 141 to receive the RF signals subject to primary output fundamental impedance matching and the other terminal being grounded through the second capacitor 155 to output the RF signals matched to the optimal output fundamental impedance. The specific structures of the specific matching circuits c-d are identical to those of the specific matching circuit 150a, so there is no need to go into details.

In some embodiments, the fundamental impedance transformer 170 further comprises a plurality of cascadable directional couplers 160 which are coupled to the output ends of the specific matching circuits 150a-d respectively. The directional couplers 160 accurately indicate the magnitude of all output power, so in actual design, it is better to adopt an EM emulator of an EDA tool to evaluate the influence on the cascadable directional couplers 161-164.

In the embodiment, the fundamental impedance transformer 170 comprises a plurality of specific matching circuits 150a-d respectively corresponding to all the output bands Band_a-d of the MMMB PA 100 so as to be specifically used by all the bands. With the specific matching circuits 150a-d, a fundamental impedance relatively close to 50Ω after the shared first segment 130 can be accurately transformed into 50Ω. In other words, the shared first segment 130 generally provides the optimal output fundamental impedance required in the process of achieving the properties of the MMMB PA 100 for all the bands Band_a-d of the wide-band amplifier channel 110 by cascading the switching array 140 and the specific second segments 150.

The specific matching circuits 150a-d are LC assemblies composed of the second inductors 151-154 and the second capacitors 155-158. The LC assemblies are accurately designed to act together with the shared first segment 130, the first switching array 140 and the directional couplers 160, so that 50Ω standard fundamental impedance at the output ports of all the bands Band_a-d of the MMMB PA 100 can be accurately transformed into the optimal output fundamental impedance required by the wide-band amplifier channel 110, and thus the MMMB PA 100 can reach all the property indices including gain, efficiency, linearity, scattering, stability margin and tolerance in all the modes of all the bands.

The specific implementation forms of the LC assemblies of the specific matching circuits 150a-d typically comprise one or more assemblies of one or more wire bonds, SMT inductors, on-chip inductors, substrate integrated inductors, on-chip capacitors, SMT capacitors and substrate integrated capacitors. Besides, the specific second segments 150 can form the MMMB PA 100 or a front-end module including the MMMB PA 100 in the form of MCM together with other semiconductor chips, SMT devices, substrates and/or lead frames in the packaging forms including SiP, flip-chip, LGA and QFN.

In addition, the number of the cascadable directional couplers 160 required for monitoring of emission power is identical to that of the specific matching circuits 150a-d. The directional couplers 160 as shown in FIG. 1, FIG. 2 and FIG. 3 comprise the directional coupler 161, the directional coupler 162, the directional coupler 163 and the directional coupler 164. The implementation forms of the cascadable directional couplers 160 comprise SiP substrate integrated microstrip lines, wire bonds/SMT and the like. Particularly, the connecting forms of the cascadable directional couplers 160 of all the bands are not limited in the series connection mode in the embodiments, and parallel connection or series-parallel connection can also be adopted.

The first switching array 140 is designed to be positioned at the junction of the shared first segment 130 and the specific second segments 150. The 2-5Ω low fundamental impedance required by the wide-band amplifier channel 110 is already transformed into high fundamental impedance relatively close to 50Ω via the shared first segment 130, and the switching array 140 inserted herein can effectively reduce the insertion loss caused by the first switching devices 141-144.

The first switching array 140 responds to the control signal from the controller 120 to select, regulate, assemble and combine the shared first segment 130 and the specific second segments 150 of the fundamental impedance transformer 170, so that the optimal output fundamental impedance required by the corresponding bands can be formed at the output port Aout of the wide-band amplifier channel 110.

The first switching array 140 can be composed of an SOI CMOS, GaAs pHEMT (Pseudomorphic HEMT) and other devices, or can be implemented in the form of the MIMIC technology, which is as shown but not limited in the embodiments of FIG. 1, FIG. 2 and FIG. 3, and the possible changes of the first switching array 140 at least include the difference of the switching devices. Besides, the first switching array 140 in the fundamental impedance transformer 170 can form the MMMB PA 100 or a front-end module including the MMMB PA 100 in the form of MCM together with other semiconductor chips, SMT devices, substrates, substrate integrated elements and/or lead frames in the packaging forms including SiP, flip-chip, wire bond, LGA and QFN.

For the accurate design of the shared first segment 130, the specific second segments 150 and the cascadable directional couplers 160 in the fundamental impedance transformer 170, it is better to adopt the EM (Electro-Magnetic) tools such as ADS Momentum, Sonnet, IE3D and HFSS and to perform circuit-EM joint simulation together with the wide-band amplifier channel 110 and the switching array 140.

As shown in FIG. 2 and FIG. 3, in another embodiment, the MMMB PA 100 further comprises a third switching array 105. The third switching array 105 comprises a plurality of third switching devices 101-103 controlled by the controller 120, and one terminal of each third switching device 101-103 is coupled with the input port Ain of the wide-band amplifier channel 110 to provide the accessed RF signals RFin for the wide-band amplifier channel 110, and the other terminals (RF input ports Band_a, Band_bc and Band_d) receive the single-band or multi-band RF signals RFin from different external ports respectively.

One embodiment of the MMMB PA 100 with multiple input ports is described in the FIG. 2. To dock the multiple output ports of RF signals RFin of a platform chipset transceiver, the third switching array 105 is additionally arranged in the MMMB PA 100 to select the RF input ports Band_a, Band_bc (to access to multiple bands) and Band_d of the MMMB PA 100 and then to connect the RF input ports to the input port Ain of the wide-band amplifier channel 110.

The third switching array 205 can be in an SPnT structure and be implemented in MMIC form through SOI CMOS, GaAs pHEMT and other devices, and is not limited in the modes in the embodiment, and the possible changes of the third switching array 205 at least include the differences in position, quantity and connection of the third switching devices 101-103. Besides, the third switching array 105 can form the MMMB PA 100 or a front-end module including the MMMB PA 100 in the form of MCM together with other semiconductor chips, SMT devices, substrates, substrate integrated elements and/or lead frames in the packaging forms including SiP, flip-chip, wire bond, LGA and QFN.

It should be particularly pointed that the third switching array 205 generally only needs to switch low power signals, so the requirements for the properties in insertion loss, linearity and the like are low, in this way, the semiconductor technology identical to or compatible with the wide-band amplifier channel 110 can be adopted, and the third switching array 205 can be integrated with the wide-band amplifier channel 110 on the same chip.

Setting of the RF input ports Band_a, Band_bc and Band_d of the MMMB PA 100 generally follows the platform chipset transceiver. In the embodiment, the RF input ports Band_a, Band_bc and Band_d have interchangeability. Generally, all the input ports of the input port Ain, connected to the same wide-band amplifier channel 100 through the STnP, in the MMMB PA 100 structure of the embodiment have interchangeability.

As shown in FIG. 3, in another embodiment, the fundamental impedance transformer 170 further comprises a harmonic impedance tuner 370 controlled by the controller 120 so that the optimal output harmonic impedance of the corresponding bands can be formed at the output port Aout of the wide-band amplifier channel 110.

Furthermore, each harmonic impedance tuner 370 comprises one or more LC resonators and a second switching array which comprises one or more second switching devices controlled by the controller. One terminal of each LC resonator is coupled with the output terminal of the wide-band amplifier channel, and the other terminals of the LC resonators are grounded through the second switching devices. As shown in FIG. 2, the LC resonators comprise third inductors 372 and 373 and third capacitors 371, and the second switching array comprises the second switching devices 374 and 375.

One harmonic impedance tuner 370 is additionally arranged at the output port Aout of the wide-band amplifier channel 110. Generally, a fixed harmonic regulator without switching devices can only act in a narrow band, while the second switching devices 374 and 375 introduced into the harmonic impedance tuner 370 can play a role in wide-band regulation, and therefore the linearity and the power amplification efficiency of the MMMB PA 100 can be enhanced in the wide bands Band_a-d. It should be pointed that the LC resonators typically present capacitance characteristics in fundamental frequency and have higher capacitive reactance, and therefore the loss of the second switching devices 374 and 375 which are properly designed can be typically negligible.

In the embodiment, the third capacitor 371 is a high-Q value capacitor, and the third inductors 372 and 373 are high-Q value inductors, wherein the possible implementation modes of the high-Q value third inductors 372 and 373 comprise one or more assemblies of one piece/set of wire bonds, substrate integrated inductors and off-chip SMT inductors. Not limited by the topology structures and modes in the embodiments, the possible changes at least element positions, connection, quantity and the like in the sense of topology structures. The possible implementation modes of the high-Q value third capacitor 371 comprise one or more assemblies of on-chip capacitors, SMT capacitors and substrate integrated capacitors. Not limited by the combination of the topology structures and modes in the embodiments, the possible changes at least comprise element positions, connection, quantity and the like in the sense of topology structures.

The second switching devices 374 and 375 in a harmonic tuned circuit 370 receive a set of control signals from the MMMB PA controller 110 to select, regulate, assemble and combine the LC resonators in the harmonic tuned circuit 370 so that the optimal output harmonic impedance required by all the modes of all the bands can be formed at the output port of the wide-band power amplifier channel.

In fact, the sensitivity of MMMB PA 100 properties to the optimal harmonic output impedance is far higher than that to the optimal fundamental output impedance, so it is generally unnecessary for the harmonic output impedance tuner to correspond to the output bands one to one. Similar to the pair of LC resonators, controlled by the two second switching devices 374 and 375, described in the embodiment of FIG. 3, the LC resonators can provide at least three useful harmonic regulation states and are suitable for the MMMB PA 100 with smaller band intervals such as MMMB PA with a brand interval of 700 MHz-915 MHz (Bands 5, 8, 12, 17-20 and the like) or 1.7-2.7 GHz (Bands 1-4, 7, 33-41 and the like). Through ingenious design, the MMMB PA can also be expanded to cover one octave of harmonic tuning.

The switching devices 374 and 375 in the tunable wide-band harmonic tuned circuit 370 can be integrated with the first switching array 140 in the same process design.

In further embodiments, the controller 110 comprises a voltage regulator and outputs the control signal including the analog domain and/or a digital domain Referring to output voltage of the voltage regulator.

Figure 4:
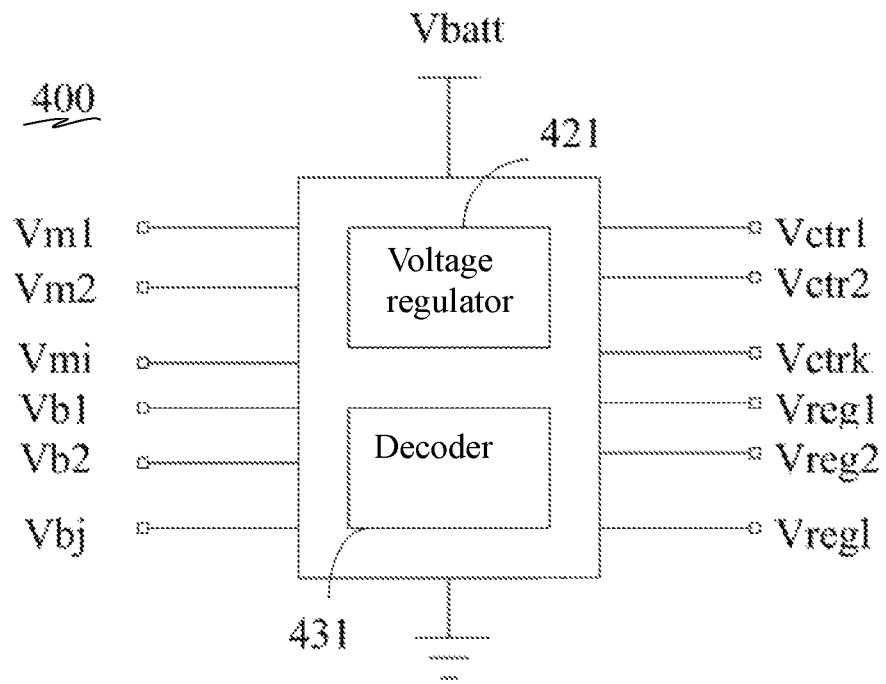
FIG. 4 is a schematic diagram of the controller of the multi-mode multi-band power amplifier in some embodiments.

In some embodiments, a controller 400 which is compatible with standards for a GPIO control interface as shown in FIG. 4 is generally powered by a terminal device power source Vbatt and receives a set of digital control signals Vm1-$i$ and Vb1-$j$ from the platform. With reference to FIG. 3 and FIG. 4, the set of signals comprise bands of the MMMB PA 100 and the mode selection external command in parallel mode. The instructions are decoded by a decoder 431 to produce a set of control voltages Vctrl-$k$ used for controlling the wide-band amplifier channel 110, the first switching array 140, the second switching array 105 and the third switching arrays (including 374 and 375 as shown in FIG. 3). The controller 400 further comprises one or more voltage regulators 421 used for producing one or one set of reference voltages, and the control voltages Vctrl-$k$ use the reference voltage(s) as a reference. When the wide-band amplifier channel 110 based on GaAs HBT, SiGe HBT and other processes is adopted for the MMMB PA 100, the reference voltage(s) is/are allocated to one set of analog control signals Vreg1-$l$ of the controller 400 according to a set of digital control signals Vm1-$i$ and Vb1-$j$ from the platform. Output ports of the set of analog control signals Vreg1-$l$ are connected with an analog control output port of the MMMB PA 100 and an analog controlled port (such as a base biasing circuit port) of the wide-band amplifier channel 110 formed by means of the GaAs HBT, SiGe HBT and other processes, thereby jointly controlling the wide-band amplifier channel 110 with the control voltages Vctrl1-$k$. To allow the wide-band amplifier channel 110 to achieve the optimal properties within a certain temperature range, the output ports of the control voltages Vctrl1-$k$ are designed to have the optimal temperature coefficient required by the wide-band amplifier channel 110 by using the bandgap mode and other modes.

Figure 5:
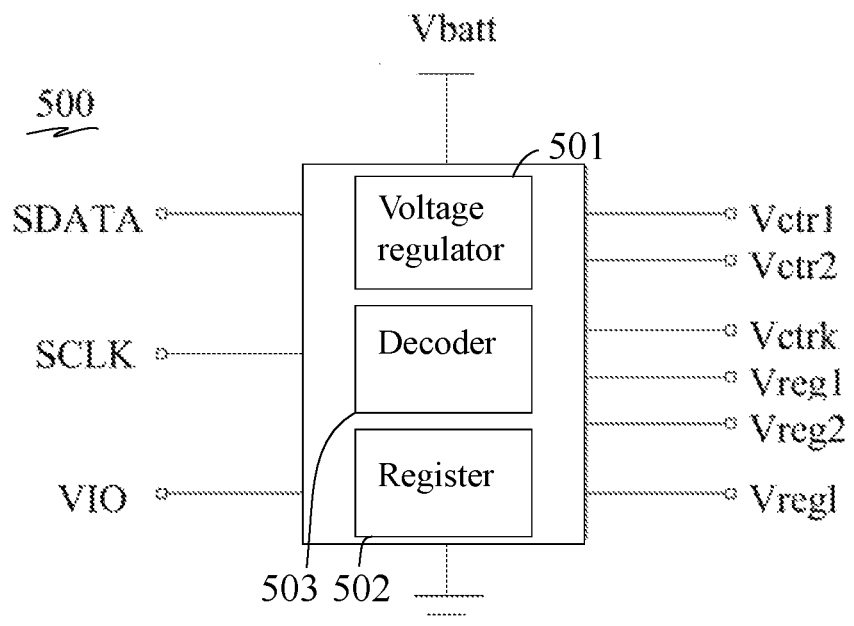
FIG. 5 is a schematic diagram of the controller of the multi-mode multi-band power amplifier in another embodiment.

A controller 500 in another embodiment as shown in FIG. 5 is compatible with standards for MIPI RF front-end control interfaces, is generally powered by the terminal device power source Vbatt and accepts a set of serial digital control signals SDATA from the platform under the participation of a clock SCLK and the reference voltage VIO. With reference to FIG. 3 and FIG. 4, the serial data control signals SDATA comprise bands of the MMMB PA 100 and the mode selection external command in parallel mode, wherein the commands are written into a set of registers 502 for temporary storage under the participation of the clock SCLK and the reference voltage VIO, and a set of control voltages Vctrl1-$k$ are produced after the external commands are decoded by the decoder 503 and are used for controlling the wide-band amplifier channel 110, the first switching array 140, the second switching array 105 and the third switching array (including 374 and 375 as shown in FIG. 3). The controller 500 further comprises one or more voltage regulators 501 used for producing one or one set of reference voltages, and the control voltages Vctrl1-$k$ typically use the reference voltage(s) as a reference. When the wide-band amplifier channel based on GaAs HBT, SiGe HBT and other processes is adopted for the MMMB PA 100, the reference voltage(s) is/are further allocated to one set of analog control signals Vreg1-$l$ of the controller 500 of the MMMB PA 100 according to a set of digital control signals Vm1-$i$ and Vb1-$j$ from the platform. Output ports of the set of analog control signals Vreg1-$l$ are connected with an analog control output port of the MMMB PA 100 and an analog controlled port (such as a base biasing circuit port) of the wide-band amplifier channel 110 formed by means of the GaAs HBT, SiGe HBT and other processes, thereby jointly controlling the wide-band amplifier channel 110 with the control voltages Vctrl1-$k$. To allow the wide-band amplifier channel to achieve the optimal properties within a certain temperature range, the output ports of the control voltages Vctrl1-$k$ are designed to have the optimal temperature coefficient required by the wide-band amplifier channel 110 by using the bandgap mode and other modes.

Although the switching arrays (the first switching array 140, the second switching array 105 and the third switching arrays (including 374 and 375 as shown in FIG. 3)) in the MMMB PA 100 disclosed in the embodiments can be generally controlled independently by control voltage Vtr1-$k$. The wide-band amplifier channel 110 can usually be controlled independently by analog signals Vreg1-$l$. The mode of jointly controlling the wide-band amplifier channel 110 and the switching arrays via one set of analog domain and/or digital domain signals produced by the controllers 110 (400 and 500) is further included.

The controller 110 compatible with standards for the SPI and I2C control interfaces is similar to the controller 110 compatible with standards for the MIPI RF front-end control interfaces and the controller 110 compatible with standards for the GPIO control interfaces, so there is no need to go into details.

Moreover, the disclosure further provides a communication terminal comprising the MMMB PA 100. The communication terminal can be a mobile phone or a PAD or an intercom or the like.

Figure 6:
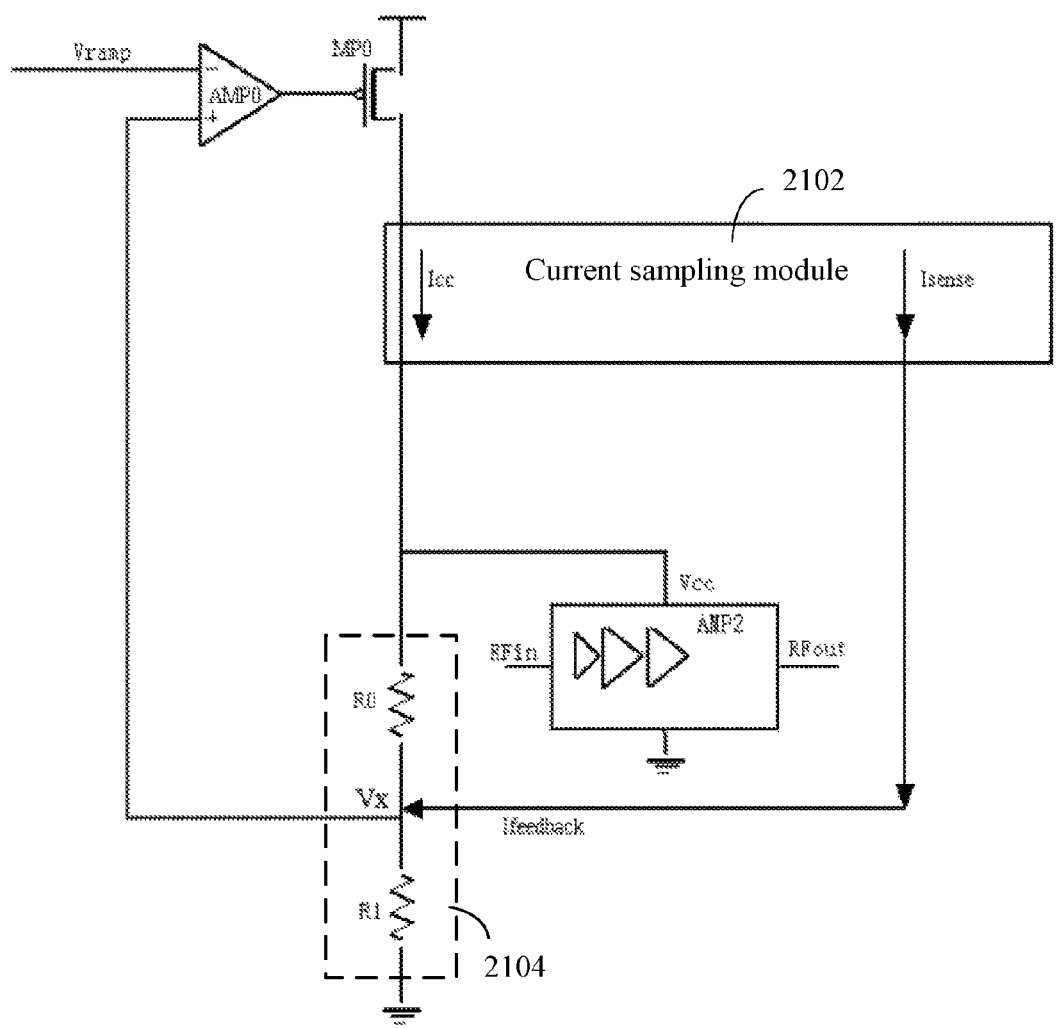
FIG. 6 is a module schematic of the power amplifier output power control circuit in some embodiments.
Figure 7:
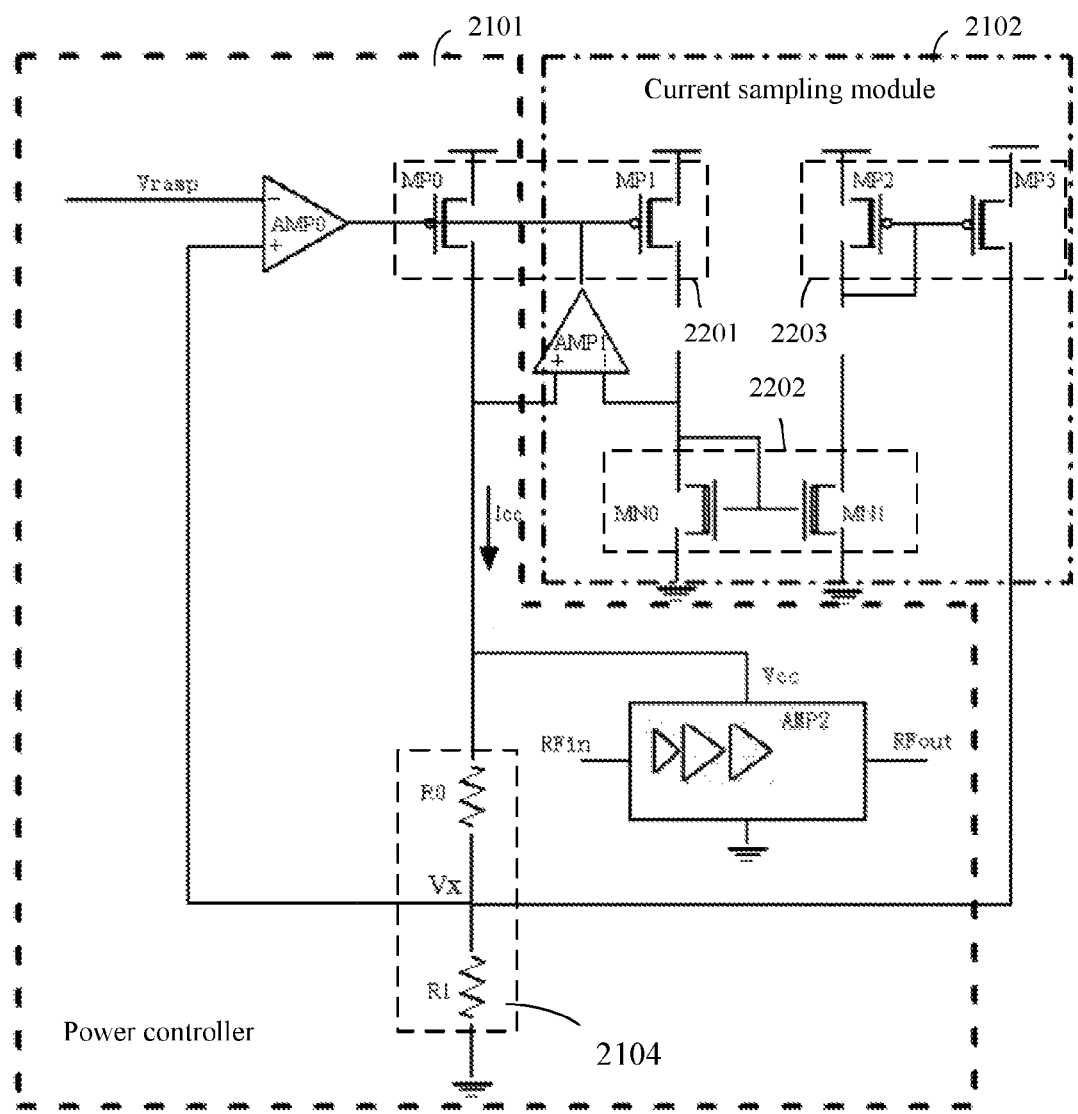
FIG. 7 is a schematic circuit diagram of a power amplifier gain attenuation circuit in an embodiment.
Figure 8:
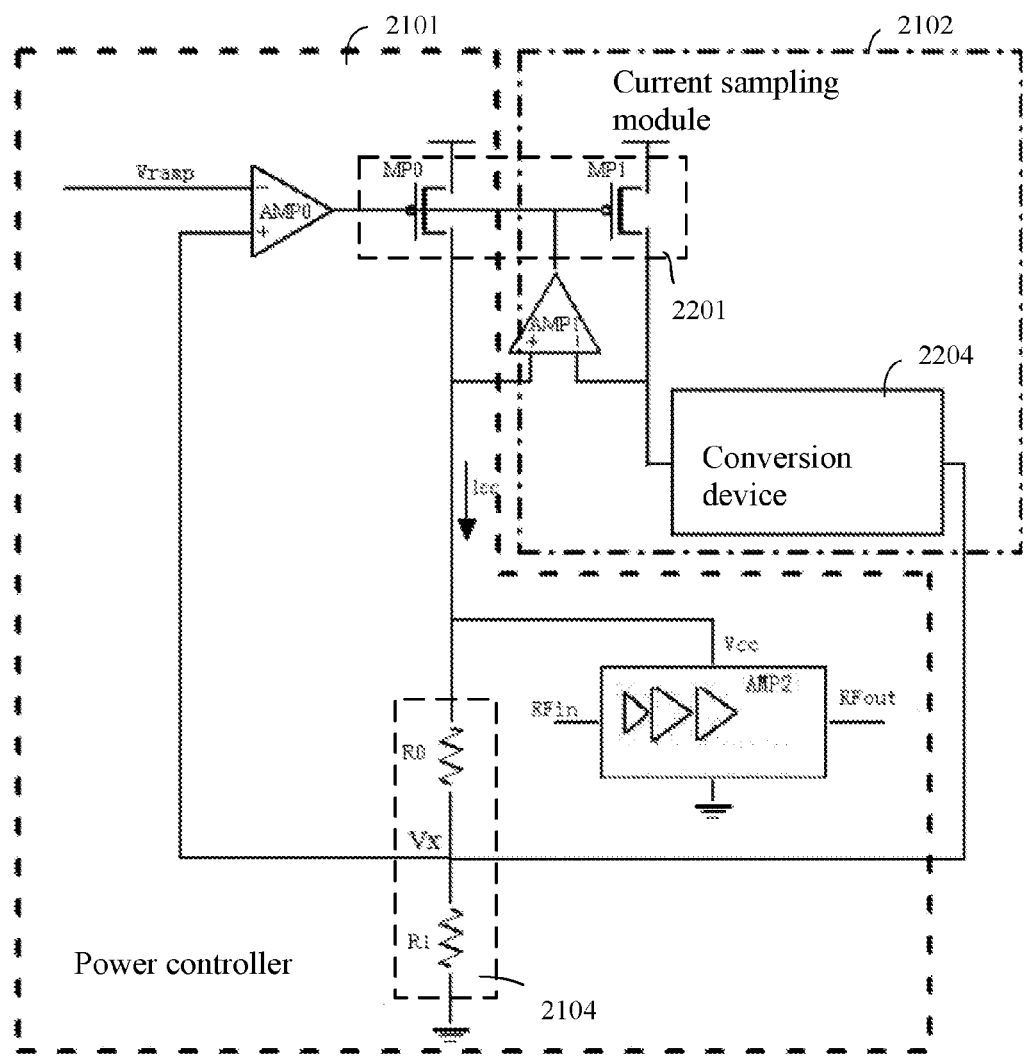
FIG. 8 is a schematic circuit diagram of a power amplifier gain attenuation circuit in another embodiment.
Figure 9:
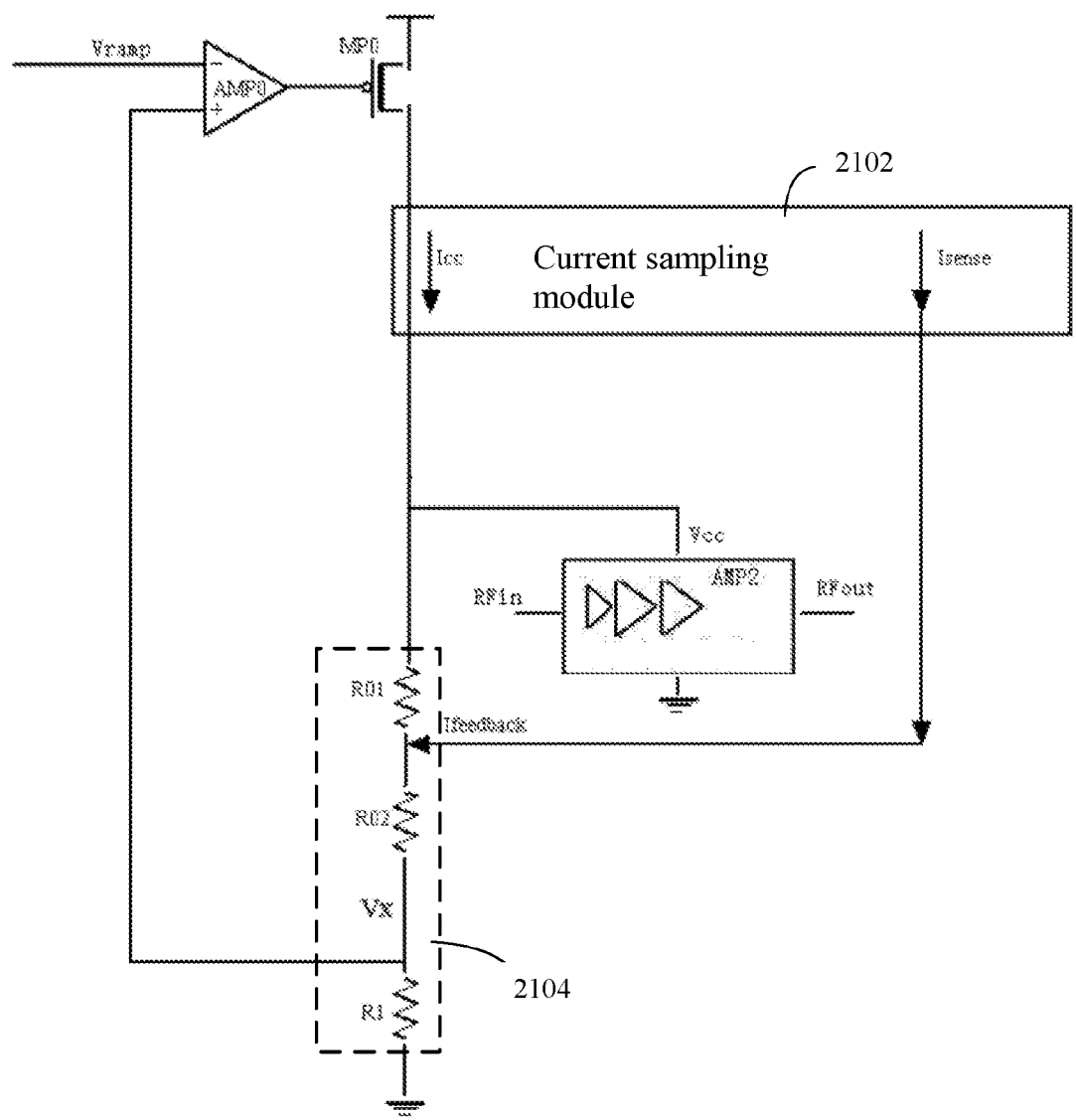
FIG. 9 is a module schematic of the power amplifier output power control circuit in another embodiment.

With reference to FIGS. 6-9, the power amplifier output power control circuit comprises a first operational amplifier AMP0, a first PMOS transistor MP0, a power amplifier AMP2, a current sampling module 2102 and a voltage dividing network 2104. Referring to FIG. 8 and FIG. 9, the power controller 2101 is composed of the first operational amplifier AMP0, the first PMOS transistor MP0 and the power amplifier AMP2 which is a RF power amplifier, and the power controller 2101 controls the magnitude of the voltage value at the power end of the power amplifier AMP2 through the magnitude of a power control signal Vramp, thus achieving power control for the power amplifier AMP2.

The negative input terminal of the first operational amplifier AMP0 receives the power control signal Vramp. The gate electrode of the first PMOS transistor MP0 is connected to the output terminal of the first operational amplifier AMP0, the source electrode of the first PMOS transistor MP0 is connected to an external power source, and the drain electrode of the first PMOS transistor MP0 is grounded via the voltage dividing network 2104. The power end Vcc of the power amplifier AMP2 is connected to the drain electrode of the first PMOS transistor MP0, the input terminal of the power amplifier AMP2 gets access to the signal RFin to be amplified, and the output terminal of the power amplifier AMP2 amplifies the signal RFout to a load (not shown in the drawings). The current sampling module 2102 produces sampling current Isense after sampling current Icc (referring to drain current across the first PMOS transistor MP0) across the first PMOS transistor MP0 and provides a negative feedback signal Ifeedback for the positive input terminal of the first operational amplifier AMP0 based on the sampling current Isense so that the total output power of the power amplifier AMP2 keep unchanged, wherein the negative feedback signal Ifeedback is input into the positive input terminal of the first operational amplifier AMP0 via the voltage dividing network 2104.

More concretely, the negative feedback signal Ifeedback is a current signal and is in inverse proportion to the voltage value at the power end Vcc of the power amplifier AMP2. The current sampling module 2102 produces sampling current Isense after sampling current Icc across the first PMOS transistor MP0 in equal proportions, the sampling current Isense is adjusted to the negative feedback signal (current) Ifeedback in proper proportions, and the negative feedback signal Ifeedback is fed back to point Vx (namely the positive input terminal of the first operational amplifier AMP0) of a traditional power controller 2101. According to the principle, when the load change of the power amplifier AMP2 causes the current Icc change, the signal Ifeedback sampled and fed back will adjust the voltage value at the power end Vcc of the power amplifier AMP2. In this way, the total output power of the amplified signal RFout output by the power amplifier AMP2 can keep unchanged, so the corresponding relationships between load impedance changes and output powers can be weakened, and therefore power control is more accurate.

Referring to FIG. 7, in some embodiments, the current sampling module 2102 comprises one or more PMOS transistors, the one or more PMOS transistors have mirror image relationships with the first PMOS transistor MP0 to copy the current Icc across the first PMOS transistor and to output the negative feedback signal Ifeedback after adjusting the negative feedback signal Ifeedback based on the current Icc across the first PMOS transistor MP0.

In a further embodiment, the current sampling module 2102 comprises a second PMOS transistor MP1, a second current mirror image 2202 and a third current mirror image 2203. The first current mirror image 2201 is formed by the second PMOS transistor MP1 and the first PMOS transistor MP0. The first current mirror image 2201, the second current mirror image 2202 and the third current mirror image 2203 are sequentially connected. The third current mirror image 2203 outputs the negative feedback signal Ifeedback.

In a further embodiment, the second current mirror image 2202 comprises a first NMOS transistor MN0 and a second NMOS transistor MN1, and the third current mirror image 2203 comprises a third PMOS transistor MP2 and a fourth PMOS transistor MP3.

The gate electrode of the second PMOS transistor MP1 is connected to the output terminal of the first operational amplifier AMP0, the source electrode of the second PMOS transistor MP1 is connected to the power source, and the drain electrode of the second PMOS transistor MP1 is connected to the drain electrode of the first NMOS transistor MN0. The gate electrode of the first NMOS transistor MN0 is connected to the drain electrode of the first NMOS transistor MN0 and the gate electrode of the second NMOS transistor MN1, the source electrode of the first NMOS transistor MN0 and the source electrode of the second NMOS transistor MN1 are grounded, and the drain electrode of the second NMOS transistor MN1 is connected to the drain electrode of the third PMOS transistor MP2. The gate electrode of the third PMOS transistor MP2 is connected to the drain electrode of the third PMOS transistor MP2 and the gate electrode of the fourth PMOS transistor MP3, the source electrode of the third PMOS transistor MP2 and the source electrode of the fourth PMOS transistor MP3 are connected to the power source, and the drain electrode of the fourth PMOS transistor MP3 outputs the negative feedback signal Ifeedback. For a circuit having a low requirement for mirror image accuracy, the second current mirror image 2202 and the third current mirror image 2203 can be removed.

Referring to FIG. 8, in another embodiment, the current sampling module 2102 samples the current Icc across the first PMOS transistor MP0 and outputs the negative feedback signal Ifeedback after current-voltage-current conversion.

In the further embodiment, the current sampling module 2102 comprises a second PMOS transistor MP1 and a conversion device 2204 used for current-voltage-current conversion, and the first current mirror image 2201 is formed by the second PMOS transistor MP1 and the first PMOS transistor MP0.

The gate electrode of the second PMOS transistor MP1 is connected to the output terminal of the first operational amplifier AMP0, the source electrode of the second PMOS transistor MP1 is connected to the power source, the drain electrode of the second PMOS transistor MP1 is connected to the input terminal of the conversion device 2204, the output terminal of the conversion device 2204 outputs the negative feedback signal Ifeedback, and the conversion device 2204 can be a current-voltage conversion chip.

In addition, current-voltage conversion can achieve a certain gate voltage via the NMOS transistors in grid-drain connection and can also achieve a resistance drop via the current across a resistor. Voltage-current conversion also can be achieved via MOS transistors in grid connection, and the current can be implemented via the voltage difference between the two ends of a resistor.

Referring to FIGS. 7 and 8, in a preferred embodiment, the current sampling module 2102 further comprises a second operational amplifier. The positive input terminal and the negative input terminal of the second operational amplifier are connected to the drain electrode of the first PMOS transistor MP0 and the drain electrode of the second PMOS transistor MP1 respectively. The output terminal of the second operational amplifier is connected to the gate electrode of the first PMOS transistor MP0 and the gate electrode of the second PMOS transistor MP1.

The positive input terminal of the second operational amplifier AMP1 is connected to the drain terminal of the first PMOS transistor MP0 so that accurate current mirror images of the first PMOS transistor and the second PMOS transistor can be obtained. Particularly, the core effect of the second operational amplifier AMP1 is to force the drain terminal voltage of the first PMOS transistor MP0 and the drain terminal voltage of the second PMOS transistor MP1 to be equal, so mirror images can be more accurate. For a circuit having a low requirement for mirror image accuracy, the second operational amplifier AMP1 can be removed.

Referring to FIGS. 6-8, in some embodiments, the voltage dividing network 2104 comprises a first resistor R1 and a second resistor R0. The first end of the first resistor R1 gets access to the negative feedback signal Ifeedback and is connected to the positive input terminal of the first operational amplifier AMP0, and the second end of the first resistor R1 is grounded. The first end of the second resistor R0 is connected to the drain electrode of the first PMOS transistor MP0, and the second end of the second resistor R0 is connected to the first end of the first resistor R1.

Referring to FIG. 7, through the negative feedback effect of the connection, the voltage across the positive input terminal (namely point Vx of the power controller 2101) of the first operational amplifier AMP0 is equal to the voltage (power control signal Vramp) across the negative input terminal of the first operational amplifier AMP0. The relationships between the voltage value "Vcc" of the power end Vcc of the GaAs power amplifier AMP2, the voltage value "Vx" of the positive input terminal of the first operational amplifier AMP0 and the voltage value "Vramp" of the negative input terminal of the first operational amplifier AMP0 are as shown in the following formula:

$$V_{CC} = \frac{R0+R1}{R1}Vx = \frac{R0+R1}{R1}Vramp$$

wherein R0 refers to the resistance value of the second resistor R0, and R1 refers to the resistance value of the first resistor R1.

In another embodiment, the feedback point of the negative feedback signal Ifeedback is not only limited at the positive input terminal (point Vx) of the first operational amplifier and can split the second resistor R0 into a third resistor R02 and a fourth resistor R01. In other words, the voltage dividing network 2104 comprises the first resistor R1, the third resistor R02 and the fourth resistor R01. The first end of the first resistor R1 is connected to the positive input terminal of the first operational amplifier AMP0, and the second end of the first resistor R1 is grounded. The first end of the third resistor gets access to the negative feedback signal Ifeedback, and the second end of the third resistor R02 is connected to the first end of the first resistor R1. The first end of the fourth resistor R01 is connected to the drain electrode of the first PMOS transistor MP0, and the second end of the fourth resistor R01 is connected to the first end of the third resistor R02. The sum of the resistance values of the fourth resistor R01 and the third resistor R02 equals to the resistance value of the second resistor R0, and the negative feedback signal Ifeedback can be fed back at the middle point between the fourth resistor R01 and the third resistor R02.

Taking the embodiment in FIG. 7 as an example for describing the circuit working principle, if the load impedance change leads to the increase in Icc of the first PMOS transistor MP0, the current across the second PMOS transistor MP1 and the first NMOS transistor MN0 increases, the current across the second NMOS transistor MN1 and the third PMOS transistor MP2 increases, and the current across the fourth PMOS transistor MP3 also increases. The potential at the positive input terminal of the first operational amplifier AMP0 is controlled by a feedback loop to be identically equal to the potential at the negative input terminal of the first operational amplifier AMP0, and therefore the current across the first resistor R1 is identically equal to Vramp/R1. When the current across the fourth PMOS transistor MP3 increases but the current across the first resistor R1 keeps unchanged, this must result in a decrease of the current across the second resistor R0, so voltage drops at the two ends of the second resistor R0 decrease, that is, the voltage value at the power end Vcc of the power amplifier AMP2 decreases. In a word, when the current Icc increases, the voltage value at the power end Vcc of the power amplifier AMP2 decreases, and the total output power can keep unchanged. If the load impedance change makes the current Icc decrease, it can be concluded in the same way that the voltage value at the power end Vcc of the power amplifier AMP2 increases, and the total output power can keep unchanged.

It can be understood that the PMOS transistors are P-channel MOS transistors, and the NMOS transistors are N-channel MOS transistors.

Moreover, the present disclosure further provides a communication terminal comprising the power amplifier output power control circuit. The communication terminal can be a mobile phone or a PAD or an intercom or the like.

Figure 10:
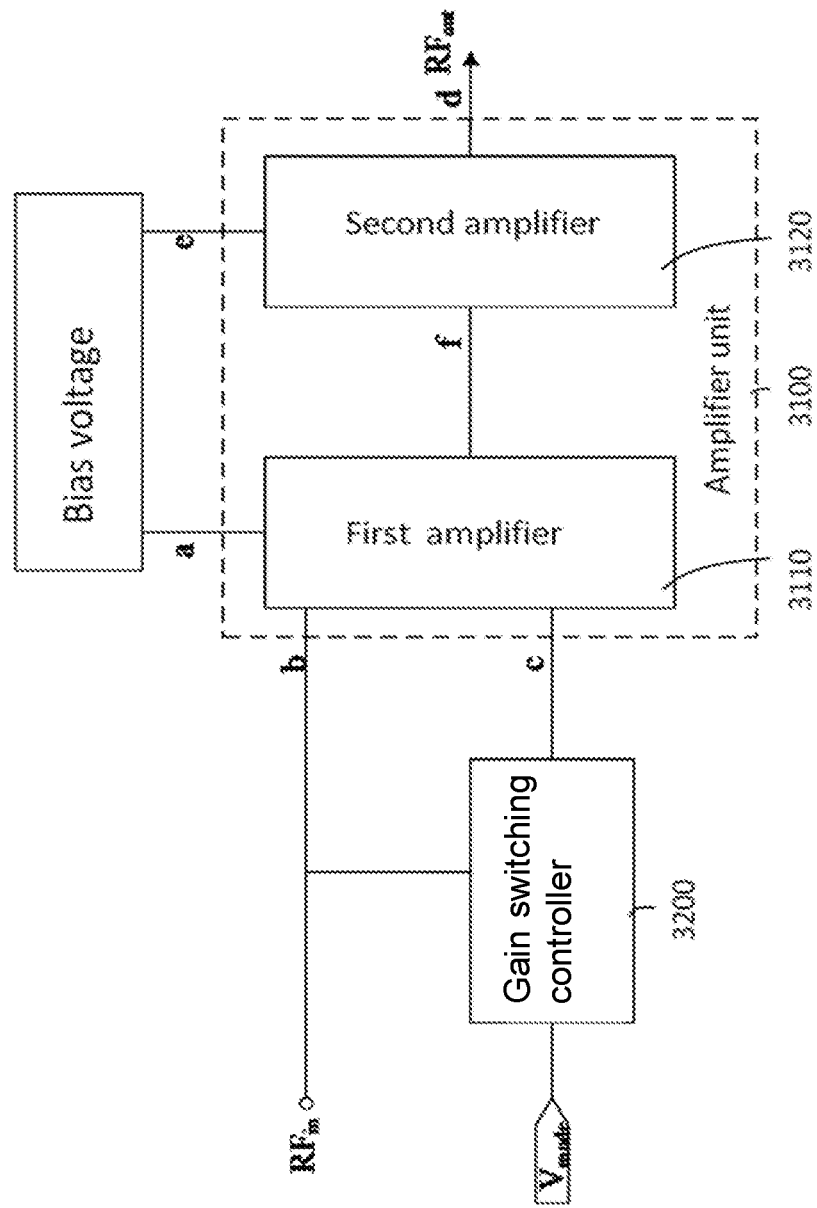
FIG. 10 is a module schematic of the power amplifier gain switching circuit.

As shown in FIG. 10, a power amplifier gain switching circuit comprises an amplifier unit 3100 and a gain switching controller 3200.

The gain control unit 3200 receives an input signal RFin, outputs an first input signal, receives a drive signal Vmode, and outputs a control signal according to the drive signal Vmode.

An amplifier unit 3100 includes: a bias input terminal a for receiving an external bias voltage, a signal input terminal b for receiving a first input signal, a control terminal c for receiving a control signal, and an output terminal d for outputting an output signal gained. An amplifier unit 3100 switches the gain factor of an output signal RFout gained according to the control signal.

In a preferred embodiment, there are either one gain control unit 3200 or multiple gain control units 3200 connected in parallel. When there are multiple gain control units 3200 connected in parallel, the first input signal output by a previous unit will be the input signal RFin for the next unit. In such a way, the gain control units 3200 of corresponding number will be controlled by external drive signals Vmode, thus gain of corresponding level can be realized for the amplifier unit 3100. For example, Referring to FIG. 11, when there is one gain control unit 3200, the amplifier unit 3100 can realize high gain or low gain output for the input signal. And Referring to FIG. 12, when there are two gain control units 3200, the amplifier unit 3100 can realize high gain, medium gain or low gain output for the input signal.

In the embodiment, the drive signal Vmode comprises a high level and a low level electric potential.

When the gain control unit 3200 (drive signal Vmode) is connected to the low level, the gain control unit 3200 will stop and not output a control signal. And when the gain control unit 3200 (drive signal Vmode) is connected to the high level, the gain control unit will turn on and output a control signal, thus reducing the gain factor of the amplifier unit 3100.

After the gain control unit 3200 blocks the input signal RFin and lowers the level, a first input signal will be generated.

Figure 11:
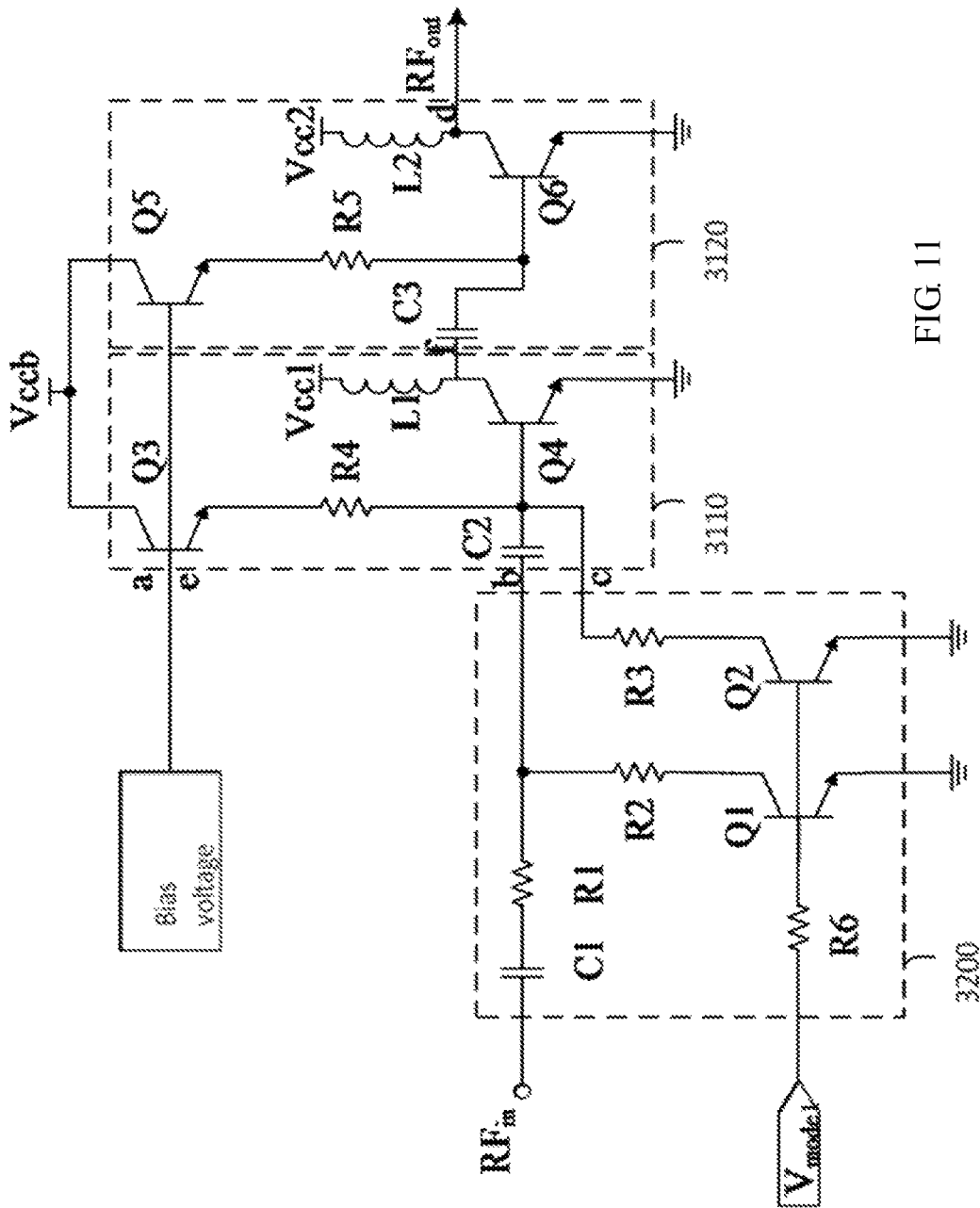
FIG. 11 is a schematic circuit diagram of the power amplifier gain switching circuit in some embodiments.
Figure 12:
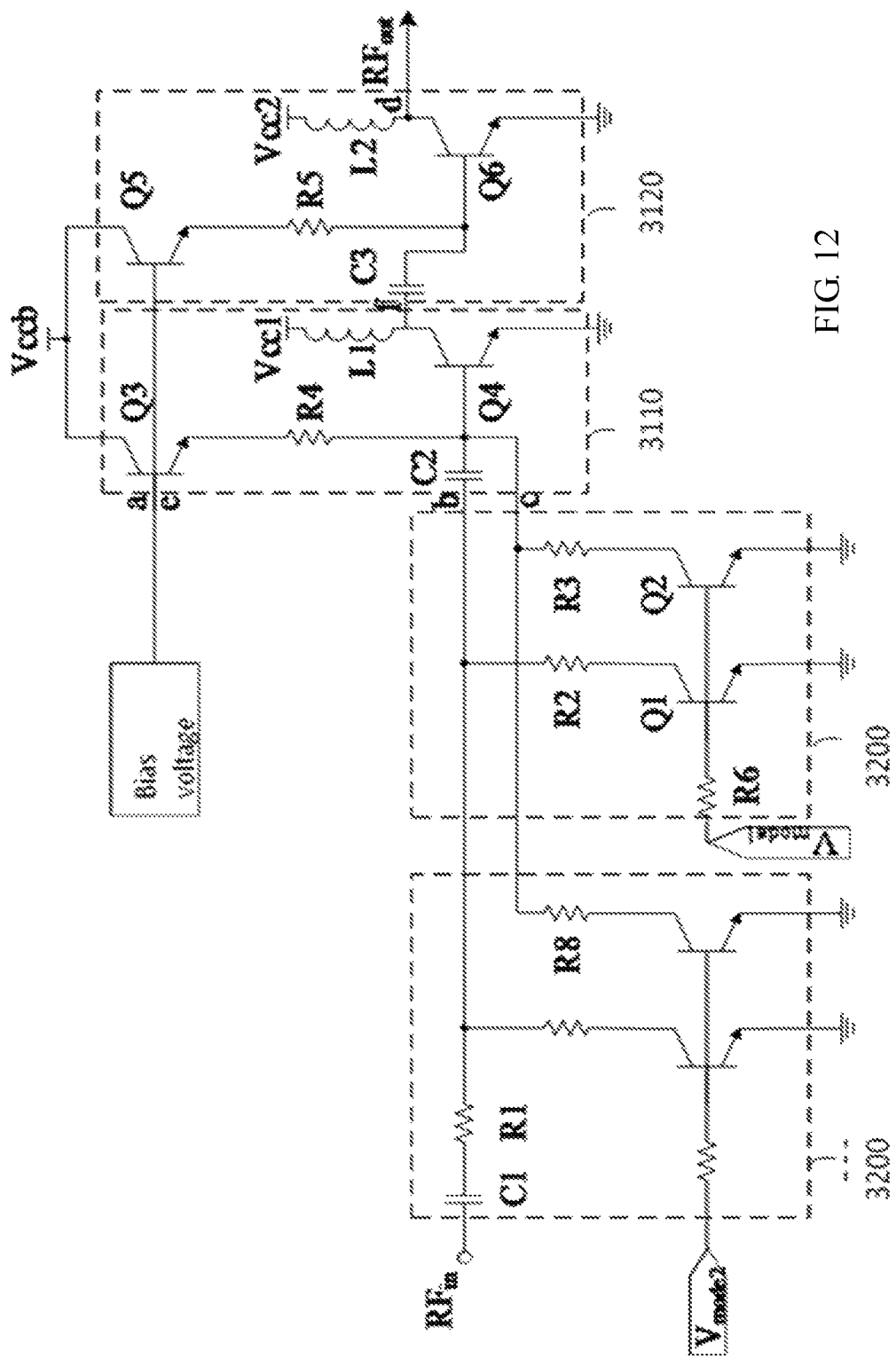
FIG. 12 is a schematic circuit diagram of the power amplifier gain switching circuit in another embodiment.

In some embodiments, and Referring to FIGS. 11 and 12, the gain control unit 3200 comprises a first DC-blocking capacitor C1, a first resistor R1, a first power transistor Q1, a second power transistor Q2, a second resistor R2 and a third resistor R3.

One terminal of the first DC-blocking capacitor C1 is used for receiving input signal RFin, with the other terminal outputs a first input signal to the signal input terminal b of the amplifier unit 3100 through the first resistor R1. The base of the first power transistor Q1 and of the second power transistor Q2 receives the drive signal Vmode through a resistor R6. The emitter of the first power transistor and of the second power transistor is grounded, and the collector of the first power transistor Q1 is connected in series with the first resistor R1 through the second resistor R2, with the collector of the second power transistor Q2 connected to the control terminal c through the third resistor R3. It can thus be seen that under the control of the drive signal Vmode, the gain control unit 3200 can block the input signal and generate the first input signal after lowering the level.

Referring to FIG. 12, when there are multiple gain control units 3200 connected in parallel, the first input signal output by a previous unit will be the input signal RFin for the next unit, i.e. the input signal RFin is received at the front terminal of a DC-blocking capacitor C4 in the gain control unit 3200 as shown on the left of the drawing, and then the first input signal will be output from the rear terminal of a resistor R7, which will then be input as the input signal RFin for the first DC-blocking capacitor C1 in the gain control unit 3200 as shown on the right of the drawing. In addition, when there are a plurality of gain reduction units, the multiple first DC-blocking capacitors C1 in the multiple gain switch units 3200 will integrate into one DC-blocking capacitor, and the multiple first resistors R1 will integrate into one resistor, in other words, the multiple first DC-blocking capacitors C1 are substituted by one DC-blocking capacitor, and the multiple first resistors R1 are substituted by one resistor; certainly more alternate resistors are available as well.

In some embodiments, and referring to FIGS. 11 and 12, the amplifier unit 3100 comprises a first amplifier 3110 and a second amplifier 3120; the first amplifier 3110 includes: a first bias input terminal a for receiving a bias voltage—a bias input terminal a of the amplifier unit 3100, a first signal input terminal b for receiving a first input signal—a signal input terminal b of the amplifier unit 3100, a first output terminal f for outputting a primary output signal gained for the first time, and a control terminal c for receiving a control signal—a control terminal c of the amplifier unit 3100.

The second amplifier 3120 includes: a second bias input terminal e for receiving a bias voltage—a bias input terminal a of the amplifier unit 3100, a second signal input terminal f for receiving a primary output signal, a second output terminal d for outputting an output signal gained for the second time—a output terminal d of the amplifier unit 3100.

In the embodiment, the first amplifier 3110 comprises a third power transistor Q3, a fourth power transistor Q4, a second DC-blocking capacitor C2, a fourth resistor R4 and a first inductor L1.

The base of the third power transistor Q3 is used as the first bias input terminal a; the collector of the third power transistor Q3 is connected to the first power supply Vccb; the emitter of the third power transistor Q3 is connected to the base of the fourth power transistor Q4 through the fourth resistor R4; the base of the fourth power transistor Q4 is used as the control terminal c; the collector of the fourth power transistor Q4 is used as the first output terminal f and connected to one terminal of the first inductor L1; the other terminal of the first inductor L1 is connected to the second power supply Vcc1; the emitter of the fourth power transistor Q4 is grounded; one terminal of the second DC-blocking capacitor C2 is used as the first signal input terminal B; the other terminal of the second DC-blocking capacitor C2 is connected to the base of the fourth power transistor Q4.

In the embodiment, the second amplifier 3120 comprises a fifth power transistor Q5, a sixth power transistor Q6, a third DC-blocking capacitor C3, a fifth resistor R5 and a second inductor L2.

The base of the fifth power transistor Q5 is used as the first bias input terminal e; the collector of the fifth power transistor Q5 is connected to the first power supply Vccb; the emitter of the fifth power transistor Q5 is connected to the base of the sixth power transistor Q6 through the fifth resistor R5; the collector of the sixth power transistor Q6 is used as the output terminal d of the amplifier unit 3100 and connected to one terminal of the first inductor L1; the other terminal of the second inductor L2 is connected to a third power supply Vcc2; the emitter of the sixth power transistor Q6 is grounded; one terminal of the third DC-blocking capacitor C3 is used as the second signal input terminal b and connected to the collector of the fourth power transistor Q4; the other terminal of the third DC-blocking capacitor is connected to the base of the sixth power transistor Q6.

Wherein, Referring to FIG. 12, the above-mentioned power transistor is a transistor. When the external drive signal Vmode1 is at high level, the first power transistor Q1 and the second power transistor Q2 will turn on, resulting in the pressure reduction of the base of the fourth power transistor Q4 (depending on the resistance of resistor R3 and resistor R8), and thus the first gain factor of the primary output signal output by the first amplifier 3110 (collector of the fourth power transistor Q4) will decrease, and finally the gain factor of the output signal RF out of the second amplifier 3120 will decrease.

Basing on the embodiment in FIG. 12, when the drive signals Vmode1 and Vmode2 are at low level, the gain control unit 3200 will not work, and the amplifier unit 3100 will be in high gain mode; when one of the drive signals Vmode1 and Vmode2 is at high level, one of the gain control unit 3200 will work, with the other one not operating, and the amplifier unit 3100 will be in medium gain mode; when both of the drive signals Vmode1 and Vmode2 are at high level, the gain control units 3200 will work simultaneously, and the amplifier unit 3100 will be in low gain mode.

In addition, a power amplifier is also provided, which comprises a bias voltage generating circuit, a drive signal generating circuit and the above-mentioned power amplifier gain switching circuit.

Figure 13:
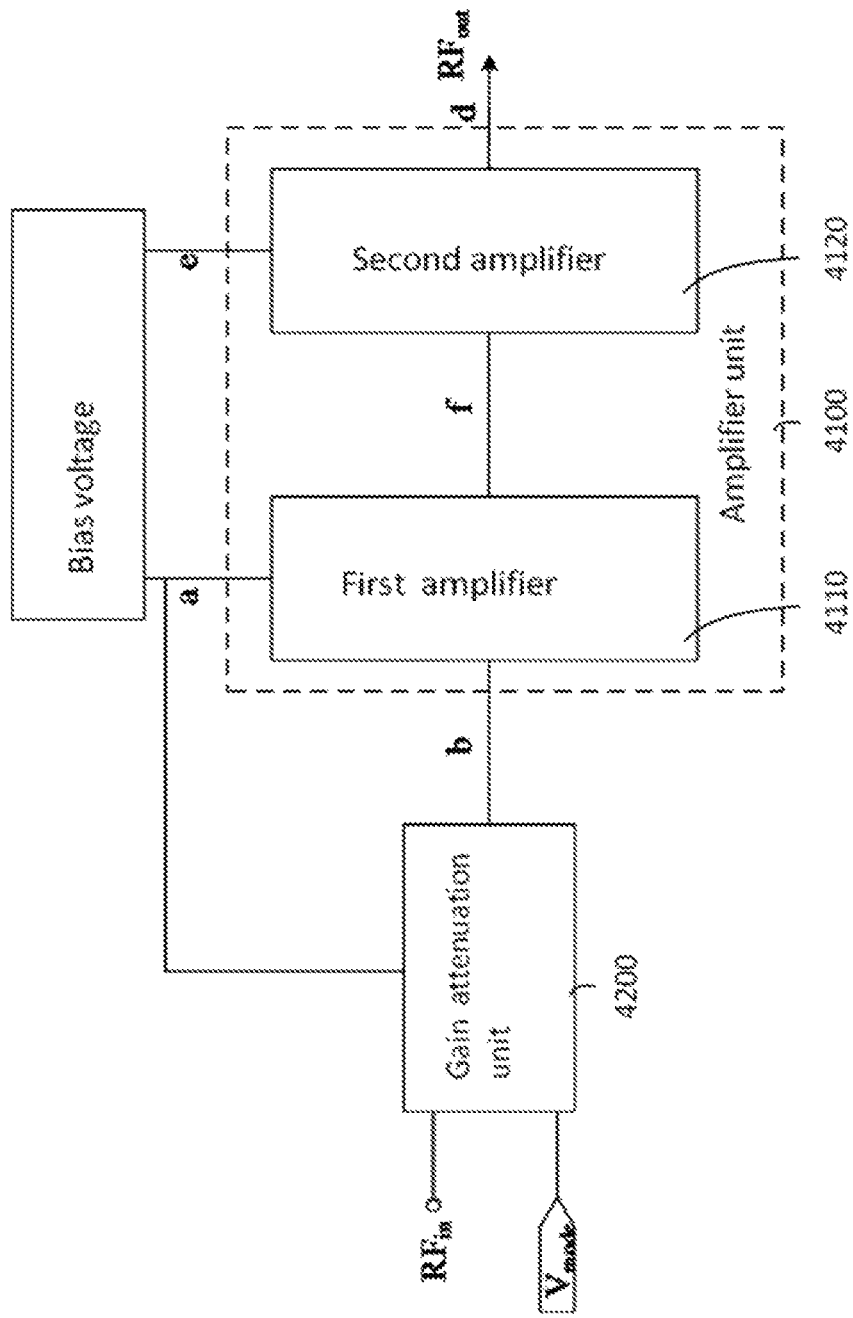
FIG. 13 is a module schematic of the power amplifier gain attenuation circuit.

In another aspect, as shown in FIG. 13, a power amplifier gain attenuation circuit comprises a amplifier unit 4100 and a gain attenuation unit 4200.

The gain attenuation unit 4200 receives an input signal RFin, an external drive signal Vmode and an external bias voltage, and outputs a secondary input signal after attenuating the input signal RFin depending on the said drive signal Vmode and bias voltage.

The amplifier unit 4100 includes: a bias input terminal a for receiving a bias voltage, a signal input terminal b for receiving a secondary input signal, and an output terminal d for outputting a gained output signal.

In some embodiments, there are either one gain attenuation unit 4200 or multiple gain attenuation units 4200 connected in parallel. When there are multiple parallel gain attenuation units 4200, the secondary input signal output by a previous unit will be the input signal RFin for the next unit. In addition, Referring to FIG. 15, when there are a plurality of gain attenuation units 4200, the multiple first DC-blocking capacitors C1 in the multiple gain attenuation units 4200 will integrate into one DC-blocking capacitor, in other words, the multiple first DC-blocking capacitors C1 are substituted by one DC-blocking capacitor; certainly more alternate resistors are available as well. In such a way, the gain attenuation units 4200 of corresponding number will be controlled by external drive signals Vmode, thus gain of corresponding level can be realized for the amplifier unit 4100. For example, Referring to FIG. 14, when there is one gain attenuation unit 4200, the amplifier unit 4100 can realize high gain or low gain output for the input signal. And Referring to FIG. 15, when there are two gain attenuation units 4200, the amplifier unit 4100 can realize high gain, medium gain or low gain output for the input signal.

In the embodiment, the drive signal Vmode comprises a high level and a low level.

When the gain attenuation unit 4200 (drive signal Vmode) gets access to the low level, the gain attenuation unit 4200 will stop without attenuating the input signal RFin; when the gain attenuation unit 4200 (drive signal Vmode) gets access to the high level, the gain attenuation unit will turn on and attenuate the input signal RFin.

After the gain attenuation unit 4200 attenuates the input signal RFin, specifically, by blocking and lowering the level, a secondary input signal will be generated.

Figure 14:
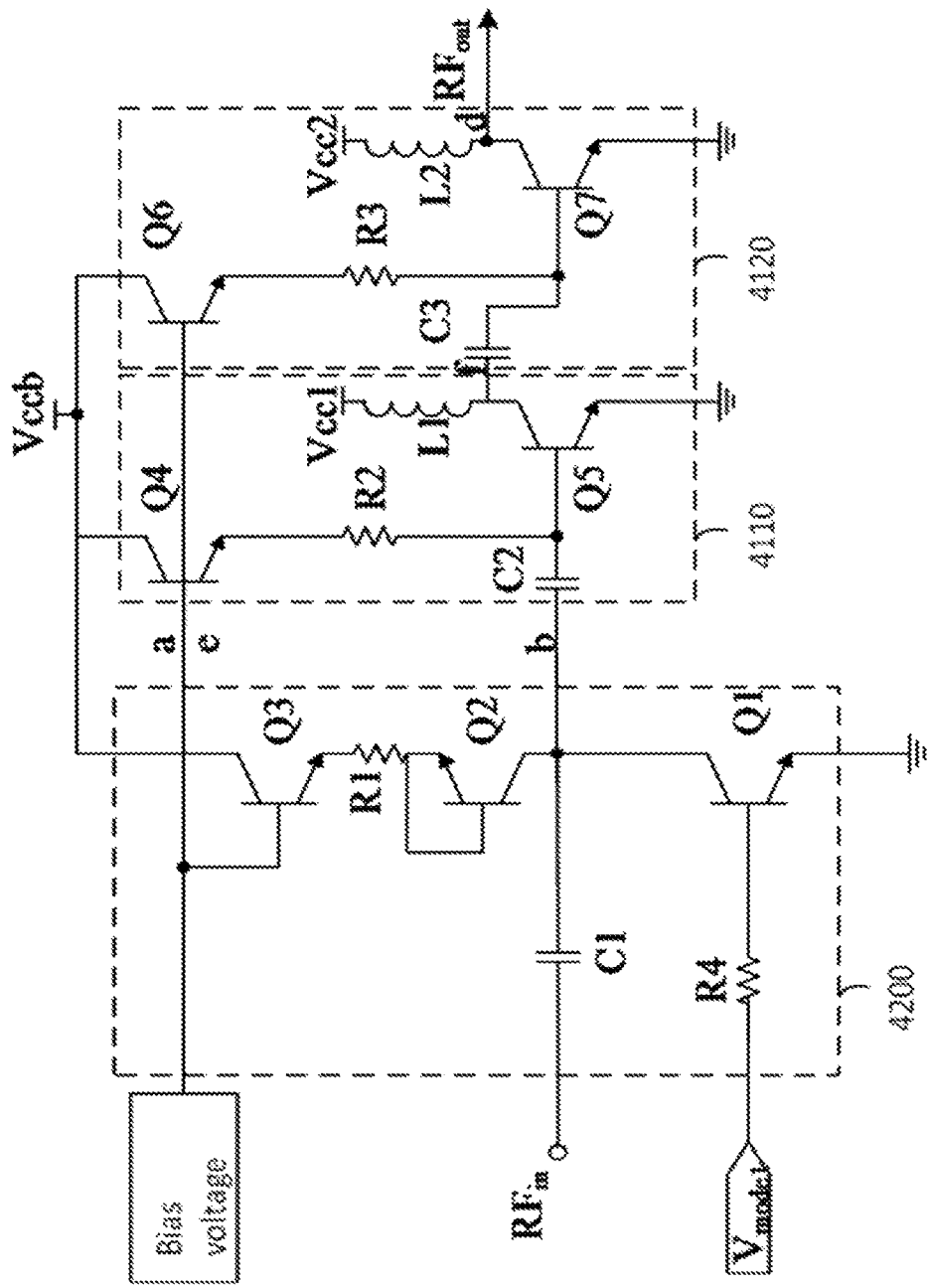
FIG. 14 is a schematic circuit diagram of a power amplifier gain attenuation circuit in an embodiment.
Figure 15:
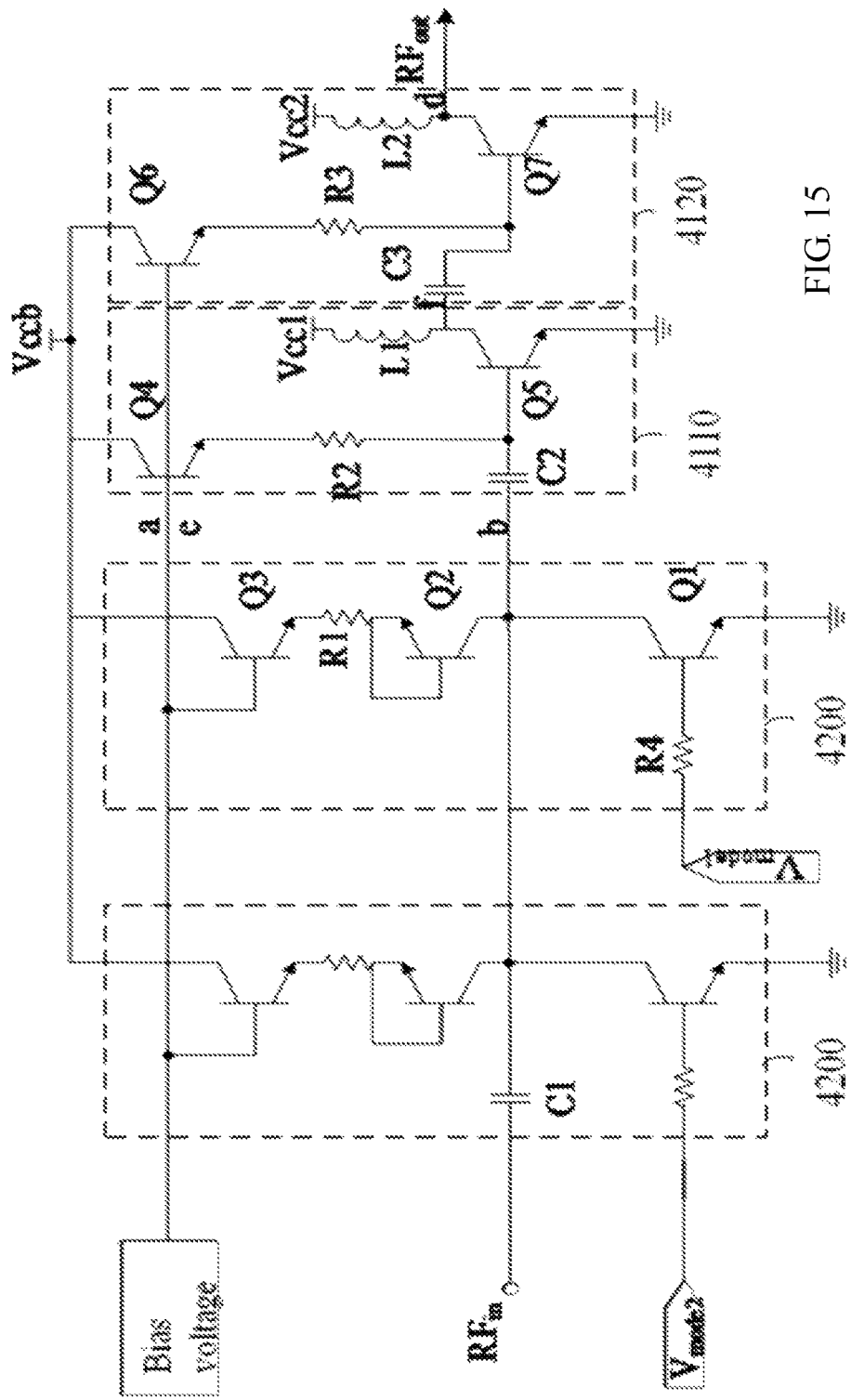
FIG. 15 is a schematic circuit diagram of a power amplifier gain attenuation circuit in another embodiment.

In some embodiments, and referring to FIGS. 14 and 15, the gain attenuation unit 4200 comprises a first DC-blocking capacitor C1, a first resistor R1, a first power transistor Q1, a second power transistor Q2 and a third power transistor Q3.

One terminal of the first DC-blocking capacitor C1 which outputs the secondary input signal is used for receiving input signal RFin. The base of the first power transistor Q1 receives a drive signal Vmode via the resistor R4. The emitter of the first power transistor Q1 is grounded, with its collector connected to the other terminal of the first DC-blocking capacitor C1. The base of the third power transistor Q3 receives a bias voltage, with its collector connected to the first power source, and emitter connected to the emitter of the second power transistor Q2 via the first resistor R1. The emitter of the second power transistor Q2 is connected to the base of the second power transistor Q2, with its collector connected to the other terminal of the first DC-blocking capacitor C1. It can thus be seen that under the control of the drive signal Vmode, the gain attenuation unit 4200 can block the input signal and generate a secondary input signal after lowering the level.

Referring to FIG. 15, when there are multiple gain attenuation units 4200 connected in parallel, the secondary input signal output by a previous unit will be the input signal RFin for the next unit, i.e. the input signal RFin is received at the front terminal of a DC-blocking capacitor C4 in the gain attenuation unit 4200 as shown on the left of the drawing, and then the secondary input signal will be output from the rear terminal of a resistor R7, which will then be input as the input signal RFin for the first DC-blocking capacitor C1 in the gain attenuation unit 4200 as shown on the right of the drawing.

In some embodiments, and referring to FIGS. 14 and 15, the amplifier unit 4100 comprises a first amplifier 4110 and a second amplifier 4120; the first amplifier 4110 includes: a first bias input terminal a for receiving a bias voltage, a first signal input terminal b for receiving a secondary input signal—a signal input terminal b of the amplifier unit 4100, a first output terminal f for outputting a primary output signal gained for the first time, and a control terminal c for receiving a control signal—a control terminal c of the amplifier unit 4100.

The second amplifier 4120 includes: a second bias input terminal e for receiving a bias voltage—a bias input terminal a of the amplifier unit 4100, a second signal input terminal f for receiving a primary output signal, a second output terminal d for outputting an output signal gained for the second time—a output terminal d of the amplifier unit 4100.

In the embodiment, the first amplifier 4110 comprises a fourth power transistor Q4, a fifth power transistor Q5, a second DC-blocking capacitor C2, a second resistor R2 and a first inductor L1.

The base of the fourth power transistor Q4 is used as the first bias input terminal a; the collector of the fourth power transistor Q4 is connected to the first power source Vccb; the emitter of the fourth power transistor Q4 is connected to the base of the fifth power transistor Q5 via the second resistor R2; the collector of the fifth power transistor Q5 is used as the first output terminal f and connected to one terminal of the first inductor L1; the other terminal of the first inductor L1 is connected to the second power source Vcc1; the emitter of the fifth power transistor Q5 is grounded; one terminal of the second DC-blocking capacitor C2 is used as the first signal input terminal b; the other terminal of the second DC-blocking capacitor C2 is connected to the base of the fifth power transistor Q5.

In the embodiment, the second amplifier 4120 comprises a sixth power transistor Q6, a seventh power transistor Q7, a third DC-blocking capacitor C3, a third resistor R3 and a second inductor L2.

The base of the sixth power transistor Q6 is used as the first bias input terminal e; the collector of the sixth power transistor Q6 is connected to the first power source Vccb; the emitter of the sixth power transistor Q6 is connected to the base of the seventh power transistor Q7 via the third resistor R3; the collector of the seventh power transistor Q7 is used as the output terminal d of the amplifier unit 4100 and connected to one terminal of the first inductor L1; the other terminal of the second inductor L2 is connected to a third power source Vcc2; the emitter of the seventh power transistor Q7 is grounded; one terminal of the third DC-blocking capacitor C3 is used as the second signal input terminal b and connected to the collector of the fifth power transistor Q5; the other terminal of the third DC-blocking capacitor C3 is connected to the base of the seventh power transistor Q7.

Referring to FIG. 14, when the drive signal Vmode1 is at low level, the first power transistor Q1 will stop, with the gain attenuation unit 4200 basically not introducing any gain attenuation, and the whole circuit will be in high gain mode; when the drive signal is at high level, the first power transistor Q1 will turn on, with the gain attenuation unit 4200 introducing gain attenuation, and the whole circuit will be in low gain mode.

Wherein, Referring to FIG. 15, the above-mentioned power transistor is a transistor. When the external drive signal Vmode1 is at high level, the first power transistor Q1, the second power transistor Q2 and the third power transistor Q3 will turn on, resulting in the pressure reduction of the base of the fifth power transistor Q4, and thus the first gain factor of the primary output signal output by the first amplifier 4110 (collector of the fifth power transistor Q4) will decrease, and finally the gain factor of the output signal RFout of the second amplifier 4120 will decrease.

Basing on the embodiment in FIG. 15, when the drive signals Vmode1 and Vmode2 are at low level, the gain attenuation unit 4200 will not work, and the amplifier unit 4100 will be in high gain mode; when one of the drive signals Vmode1 and Vmode2 is at high level, one of the gain control units 4200 will work, with the other one not operating, and the amplifier unit 4100 will be in medium gain mode; when both of the drive signals Vmode1 and Vmode2 are at high level, the gain attenuation units 4200 will work simultaneously, and the amplifier unit 4100 will be in low gain mode.

In addition, a power amplifier is also provided, which comprises a bias voltage generating circuit, a drive signal generating circuit and the above-mentioned power amplifier gain attenuation circuit.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A power amplifier gain switching circuit, comprising:
a gain controller configured to receive an external input signal, output a first input signal, receive an external drive signal, and output a control signal based on the drive signal;
an amplifier including:
a bias input terminal configured to receive an external bias voltage;
a signal input terminal configured to receive the first input signal;
a control terminal configured to receive the control signal; and
an output terminal configured to output an output signal with a gain;
wherein:
the amplifier is configured to switch a gain factor of the output signal based on the control signal;
the gain controller comprises a first DC-blocking capacitor, a first resistor, a first power transistor, a second power transistor, a second resistor, and a third resistor,
one terminal of the first DC-blocking capacitor is configured to receive the input signal, and another terminal of the first DC-blocking capacitor is configured to output the first input signal through the first resistor; and
the first and second power transistors have bases configured to receive the drive signal, and emitters grounded; a collector of the first power transistor is connected in series with the first resistor through the second resistor, and a collector of the second power transistor is connected with the control terminal through the third resistor.

2. The power amplifier gain switching circuit of claim 1, wherein the gain controller comprises a plurality of gain control units connected in parallel.

3. The power amplifier gain switching circuit of claim 2, wherein first DC-blocking capacitors in the gain control units are combined into one DC-blocking capacitor, and first resistors in the gain control units are combined into one resistor.

4. The power amplifier gain switching circuit of claim 1, wherein:
the drive signal comprises a high level and a low level;
if the gain controller receives the low level, the gain controller will stop and not output the control signal; and
if the gain controller receives the high level, the gain controller will turn on and output the control signal, thereby reducing the gain factor of the output signal.

5. The power amplifier gain switching circuit of claim 1, wherein: the gain controller is configured to DC-block and pull down the external input signal to generate the first input signal.

6. The power amplifier gain switching circuit of claim 1, wherein:
the amplifier comprises a first amplifier and a second amplifier;
the first amplifier includes:
a first bias input terminal configured to receive the external bias voltage;
a first signal input terminal configured to receive the first input signal;
a first output terminal configured to output a primary output signal gained for a first time, and
the control terminal configured to receive the control signal; and
the second amplifier includes:
a second bias input terminal configured to receive the bias voltage;
a second signal input terminal configured to receive the primary output signal; and
a second output terminal configured to output the output signal gained for a second time.

7. The power amplifier gain switching circuit of claim 6, wherein:
the first amplifier comprises a third power transistor, a fourth power transistor, a second DC-blocking capacitor, a fourth resistor, and a first inductor;
a base of the third power transistor is configured as the first bias input terminal;
a collector of the third power transistor is connected to a first power supply;
an emitter of the third power transistor is connected to a base of the fourth power transistor through the fourth resistor;
a base of the fourth power transistor is configured as the control terminal;
a collector of the fourth power transistor is configured as the first output terminal and connected to one terminal of the first inductor;
another terminal of the first inductor is connected to a second power supply;
an emitter of the fourth power transistor grounded;
one terminal of the second DC-blocking capacitor is configured as the first signal input terminal; and
another terminal of the second DC-blocking capacitor is connected to a base of the fourth power transistor.

8. The power amplifier gain switching circuit of claim 6, wherein:
the second amplifier comprises a fifth power transistor, a sixth power transistor, a third DC-blocking capacitor, a fifth resistor, and a second inductor;
a base of the fifth power transistor is configured as the first bias input terminal;
a collector of the fifth power transistor is connected to the first power supply;
an emitter of the fifth power transistor is connected to a base of the sixth power transistor through the fifth resistor;
a collector of the sixth power transistor is configured as the output terminal of the amplifier and connected to one terminal of the first inductor;
another terminal of the second inductor is connected to a third power supply;
an emitter of the sixth power transistor grounded;
one terminal of the third DC-blocking capacitor is configured as the second signal input terminal and connected to the collector of the fourth power transistor; and
another terminal of the third DC-blocking capacitor is connected to a base of the sixth power transistor.

9. A power amplifier gain switching circuit, comprising:
a gain controller configured to receive an external input signal, output a first input signal, receive an external drive signal, and output a control signal based on the drive signal; wherein the gain controller comprises a plurality of gain control units connected in parallel;

an amplifier including:
  a bias input terminal configured to receive an external bias voltage;
  a signal input terminal configured to receive the first input signal;
  a control terminal configured to receive the control signal; and
  an output terminal configured to output an output signal with a gain;
  wherein the amplifier is configured to switch a gain factor of the output signal based on the control signal;
  each gain control unit comprises a first DC-blocking capacitor, a first resistor, a first power transistor, a second power transistor, a second resistor, and a third resistor,
  one terminal of the first DC-blocking capacitor is configured to receive the input signal, and another terminal of the first DC-blocking capacitor is configured to output the first input signal through the first resistor;
  the first and second power transistors have bases configured to receive the drive signal, and emitters grounded;
  a collector of the first power transistor is connected in series with the first resistor through the second resistor, and a collector of the second power transistor is connected with the control terminal through the third resistor.

10. The power amplifier gain switching circuit of claim 9, wherein first DC-blocking capacitors in the gain control units are combined into one DC-blocking capacitor, and first resistors in the gain control units are combined into one resistor.

11. The power amplifier gain switching circuit of claim 10, wherein:
  the drive signal comprises a high level and a low level;
  if the gain control unit receives the low level, the gain control unit will stop and not output the control signal; and
  if the gain control unit receives the high level, the gain control unit will turn on and output the control signal, thereby reducing the gain factor of the output signal.

12. The power amplifier gain switching circuit of claim 9, wherein:
  the gain controller is configured to DC-block and pull down the external input signal to generate the first input signal.

13. The power amplifier gain switching circuit of claim 9, wherein:
  the amplifier comprises a first amplifier and a second amplifier;
  the first amplifier includes:
    a first bias input terminal configured to receive the external bias voltage;
    a first signal input terminal configured to receive the first input signal;
    a first output terminal configured to output a primary output signal gained for a first time, and
    the control terminal configured to receive the control signal; and
  the second amplifier includes:
    a second bias input terminal configured to receive the bias voltage;
    a second signal input terminal configured to receive the primary output signal; and
    a second output terminal configured to output the output signal gained for a second time.

14. The power amplifier gain switching circuit of claim 13, wherein:
  the first amplifier comprises a third power transistor, a fourth power transistor, a second DC-blocking capacitor, a fourth resistor, and a first inductor;
  a base of the third power transistor is configured as the first bias input terminal;
  a collector of the third power transistor is connected to a first power supply;
  an emitter of the third power transistor is connected to a base of the fourth power transistor through the fourth resistor;
  a base of the fourth power transistor is configured as the control terminal;
  a collector of the fourth power transistor is configured as the first output terminal and connected to one terminal of the first inductor;
  another terminal of the first inductor is connected to a second power supply;
  an emitter of the fourth power transistor grounded;
  one terminal of the second DC-blocking capacitor is configured as the first signal input terminal; and
  another terminal of the second DC-blocking capacitor is connected to a base of the fourth power transistor.

15. The power amplifier gain switching circuit of claim 14, wherein:
  the second amplifier comprises a fifth power transistor, a sixth power transistor, a third DC-blocking capacitor, a fifth resistor, and a second inductor;
  a base of the fifth power transistor is configured as the first bias input terminal;
  a collector of the fifth power transistor is connected to the first power supply;
  an emitter of the fifth power transistor is connected to a base of the sixth power transistor through the fifth resistor;
  a collector of the sixth power transistor is configured as the output terminal of the amplifier and connected to one terminal of the first inductor;
  another terminal of the second inductor is connected to a third power supply;
  an emitter of the sixth power transistor grounded;
  one terminal of the third DC-blocking capacitor is configured as the second signal input terminal and connected to the collector of the fourth power transistor; and
  another terminal of the third DC-blocking capacitor is connected to a base of the sixth power transistor.

16. A power amplifier comprising:
  a bias voltage generating circuit configured to generate a bias voltage;
  a drive signal generating circuit configured to generate a drive signal; and
  a power amplifier gain switching circuit including:
    a gain controller configured to receive an external input signal, output a first input signal, receive the drive signal, and output a control signal based on the drive signal;
  an amplifier including:
    a bias input terminal configured to receive the bias voltage;
    a signal input terminal configured to receive the first input signal;
    a control terminal configured to receive the control signal; and
    an output terminal configured to output an output signal with a gain;

wherein:
the amplifier is configured to switch a gain factor of the output signal based on the control signal;
the gain controller comprises a first DC-blocking capacitor, a first resistor, a first power transistor, a second power transistor, a second resistor, and a third resistor,
one terminal of the first DC-blocking capacitor is configured to receive the input signal, and another terminal of the first DC-blocking capacitor is configured to output the first input signal through the first resistor; and
the first and second power transistors have bases configured to receive the drive signal, and emitters grounded; a collector of the first power transistor is connected in series with the first resistor through the second resistor, and a collector of the second power transistor is connected with the control terminal through the third resistor.

17. The power amplifier of claim 16, wherein:
the gain controller comprises a plurality of gain control units connected in parallel;
first DC-blocking capacitors in the gain control units are combined into one DC-blocking capacitor; and
first resistors in the gain control units are combined into one resistor.

18. The power amplifier of claim 16, wherein:
the gain controller is configured to DC-block and pull down the external input signal to generate the first input signal.

* * * * *